United States Patent
Xia et al.

(10) Patent No.: US 11,928,424 B2
(45) Date of Patent: *Mar. 12, 2024

(54) FACILITATING CUSTOMIZATION AND PROLIFERATION OF STATE MODELS

(71) Applicant: Opendoor Labs Inc., San Francisco, CA (US)

(72) Inventors: Tianyi Xia, San Francisco, CA (US); Leonid Boris Pekelis, San Francisco, CA (US); David Makanalani Lundgren, San Francisco, CA (US)

(73) Assignee: Opendoor Labs Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/994,839

(22) Filed: Nov. 28, 2022

(65) Prior Publication Data

US 2023/0086659 A1    Mar. 23, 2023

Related U.S. Application Data

(63) Continuation of application No. 16/668,747, filed on Oct. 30, 2019, now Pat. No. 11,556,701.

(Continued)

(51) Int. Cl.
*G06F 40/00* (2020.01)
*G06F 30/20* (2020.01)
(Continued)

(52) U.S. Cl.
CPC ............ *G06F 40/177* (2020.01); *G06F 30/20* (2020.01); *G06Q 30/0206* (2013.01); *G06Q 50/16* (2013.01)

(58) Field of Classification Search
CPC ... G06F 40/177; G06F 30/20; G06Q 30/0206; G06Q 50/16
See application file for complete search history.

(56) References Cited

U.S. PATENT DOCUMENTS 6,609,109 B1 *  8/2003  Bradley ................. G06Q 40/02
                                                          705/35
9,607,310 B2 *  3/2017  Strauss .............. G06Q 30/0202

(Continued)

OTHER PUBLICATIONS

"U.S. Appl. No. 16/668,747, Advisory Action dated Dec. 17, 2021", 5 pgs.

(Continued)

*Primary Examiner* — William L Bashore
*Assistant Examiner* — David Faber
(74) *Attorney, Agent, or Firm* — Schwegman Lundberg & Woessner, P.A.

(57) ABSTRACT

Systems and methods to facilitate a customization and proliferation of models are described. The system receives, via a first interface, table information and communicates the table information to a first model. The first model includes logic to process the values to generate a column of predicted values. The system receives a column of predicted values from the first model. The system appends the column of predicted values to the table information to generate appended table information. The system communicates, via a second interface, the appended table information to a second state including a second plurality of models. The sequence of states is associated with a plurality of interfaces including the first interface and the second interface. The interfaces facilitate a customization and proliferation of models.

20 Claims, 16 Drawing Sheets

Related U.S. Application Data

(60) Provisional application No. 62/870,611, filed on Jul. 3, 2019.

(51) Int. Cl.
  *G06F 40/177* (2020.01)
  *G06Q 30/0201* (2023.01)
  *G06Q 50/16* (2012.01)

(56) References Cited

U.S. PATENT DOCUMENTS

| | | | |
|---|---|---|---|
| 11,093,982 B1* | 8/2021 | Humphries | G06Q 30/0278 |
| 11,205,236 B1* | 12/2021 | Smith | G06N 3/08 |
| 11,556,701 B2 | 1/2023 | Xia et al. | |
| 2008/0306982 A1* | 12/2008 | Moudy | G06Q 30/02 |
| | | | 707/999.102 |
| 2009/0182679 A1* | 7/2009 | Harrington | G06Q 30/00 |
| | | | 705/80 |
| 2010/0042442 A1* | 2/2010 | Seitomer | G06Q 40/00 |
| | | | 707/E17.005 |
| 2012/0158748 A1 | 6/2012 | Smintina et al. | |
| 2013/0262186 A1* | 10/2013 | Lazarre | G06Q 50/16 |
| | | | 705/7.35 |
| 2015/0324939 A1* | 11/2015 | Malaviya | H04L 67/306 |
| | | | 705/14.66 |
| 2017/0235848 A1* | 8/2017 | Van Dusen | G06F 16/904 |
| | | | 705/12 |
| 2018/0088753 A1* | 3/2018 | Viégas | G06F 40/216 |
| 2018/0203836 A1* | 7/2018 | Singh | G06F 40/18 |
| 2019/0180358 A1* | 6/2019 | Nandan | G06F 18/2113 |
| 2020/0334306 A1* | 10/2020 | Baughman | G06N 20/20 |
| 2021/0004435 A1 | 1/2021 | Xia et al. | |
| 2021/0264102 A1* | 8/2021 | Zhang | G06F 16/3335 |
| 2022/0084079 A1* | 3/2022 | Stewart | G06Q 30/0206 |

OTHER PUBLICATIONS

"U.S. Appl. No. 16/668,747, Final Office Action dated Jul. 30, 2021", 19 pgs.

"U.S. Appl. No. 16/668,747, Non Final Office Action dated Apr. 7, 2022", 25 pgs.

"U.S. Appl. No. 16/668,747, Non Final Office Action dated Oct. 14, 2020".

"U.S. Appl. No. 16/668,747, Notice of Allowance dated Aug. 31, 2022", 11 pgs.

"U.S. Appl. No. 16/668,747, Response filed Jan. 14, 2021 to Non Final Office Action dated Oct. 14, 2020", 14 pgs.

"U.S. Appl. No. 16/668,747, Response filed Jul. 7, 2022 to Non Final Office Action dated Apr. 7, 2022", 17 pgs.

"Application Serial No. 16/668, 747, Response filed Sep. 30, 2021 to Final Office Action dated Jul. 30, 2021", 15 pgs.

"U.S. Appl. No. 16/668,747, Response to Advisory Action dated Dec. 17, 2021 dated Dec. 30, 2021", 16 pgs.

"notmfb May 13, 2012 https://www.youtube.com/watch?v=csxSUiL1d5A", https://www.youtube.com/watch?v=csxSUiL1d5A, 3 pgs.

"Screen captures from YouTube video clip entitled Excel-Link Data Between Worksheets in a Workbook in Excel," 2 pages, uploaded on Dec. 13, 2012 by user "TeachExcel" Retrieved from Internet:, https://www.youtube.com/watch?v=rDMfksl3n7M, 2 pgs.

Weaver, Alan, "Excel p. 480 real estate sales report", (Oct. 12, 2018), 1 pg.

"U.S. Appl. No. 16/668,747, 312 Amendment filed Nov. 30, 2022", 9 pgs.

"U.S. Appl. No. 16/668,747, PTO Response to Rule 312 dated Dec. 15, 2022", 2 pgs.

\* cited by examiner

420

INPUT INTERFACE — 402

| NAME 408 | TYPE 410 | SIZE 412 |
|---|---|---|
| OBJECT IDENTIFIER | ALPHANUMERIC | 10 ⌒406 |
| LIST DATE | DATE | 10 ⌒406 |
| INVENTORY WEEK | DATE | 10 ⌒406 |
| INITIAL LIST PRICE | CURRENCY | 10 ⌒406 |
| CONDITION DATE | DATE | 10 ⌒406 |
| CURRENT LIST PRICE | CURRENCY | 10 ⌒406 |

OUTPUT INTERFACE — 404

| NAME 408 | TYPE 410 | SIZE 412 |
|---|---|---|
| OBJECT IDENTIFIER | ALPHANUMERIC | 10 ⌒406 |
| LIST DATE | DATE | 10 ⌒406 |
| INVENTORY WEEK | DATE | 10 ⌒406 |
| INITIAL LIST PRICE | CURRENCY | 10 ⌒406 |
| CONDITION DATE | DATE | 10 ⌒406 |
| CURRENT LIST PRICE | CURRENCY | 10 ⌒406 |
| LIST PRICE | CURRENCY | 10 ⌒406 |

| 502 | 504 | 506 | 508 | 510 | 512 |
|---|---|---|---|---|---|
| OBJECT ID | LIST DATE | INVENTORY WEEK | INITIAL LIST PRICE | CONDITION DATE | CURRENT LIST PRICE |
| A | 2019_6_1 | 2019_6_1 | 200,000.00 | N/A | N/A |
| A | 2019_6_1 | 2019_6_8 | 200,000.00 | N/A | N/A |
| B | 2019_6_1 | 2019_6_1 | 500,000.00 | 2019_6_8 | 450,000.00 |
| B | 2019_6_1 | 2019_6_8 | 500,000.00 | 2019_6_8 | 450,000.00 |
| B | 2019_6_1 | 2019_6_15 | 500,000.00 | 2019_6_8 | 450,000.00 |

| 502 | 504 | 506 | 508 | 510 | 512 | 514 |
|---|---|---|---|---|---|---|
| OBJECT ID | LIST DATE | INVENTORY WEEK | INITIAL LIST PRICE | CONDITION DATE | CURRENT LIST PRICE | LIST PRICE |
| A | 2019_6_1 | 2019_6_1 | 200,000.00 | N/A | N/A | 200,000.00 |
| A | 2019_6_1 | 2019_6_8 | 200,000.00 | N/A | N/A | 195,000.00 |
| B | 2019_6_1 | 2019_6_1 | 500,000.00 | 2019_6_8 | 450,000.00 | 500,000.00 |
| B | 2019_6_1 | 2019_6_8 | 500,000.00 | 2019_6_8 | 450,000.00 | 450,000.00 |
| B | 2019_6_1 | 2019_6_15 | 500,000.00 | 2019_6_8 | 450,000.00 | 445,000.00 |

*FIG. 5B*

FACILITATING CUSTOMIZATION AND PROLIFERATION OF STATE MODELS

RELATED APPLICATION

This application is a continuation of U.S. patent application Ser. No. 16/668,747, filed Oct. 30, 2019, which claims the benefit of U.S. Provisional Patent Application No. 62/870,611, filed Jul. 3, 2019, all of which are incorporated by reference in their entirety.

TECHNICAL FIELD

This disclosure relates to the technical field of data communications and more particularly to customization and proliferation of state models.

BACKGROUND

A model comprised of logic may be used to process an object through a state to predict a result. In some instances, different iterations of the model may be used to process slightly different input in slightly different ways to predict slightly different results. Diversification in modeling is advantageous because it may lead to better predictions; however, it may also lead to an unwieldly customization and proliferation of the model.

BRIEF DESCRIPTION OF THE DRAWINGS

FIG. 4F is a block diagram illustrating an example, according to an embodiment;

FIG. 4G is a block diagram illustrating an example, according to an embodiment;

FIG. 5A is a block diagram illustrating table information, according to an embodiment;

FIG. 5B is a block diagram illustrating appended table information, according to an embodiment;

DETAILED DESCRIPTION

Figure 1:
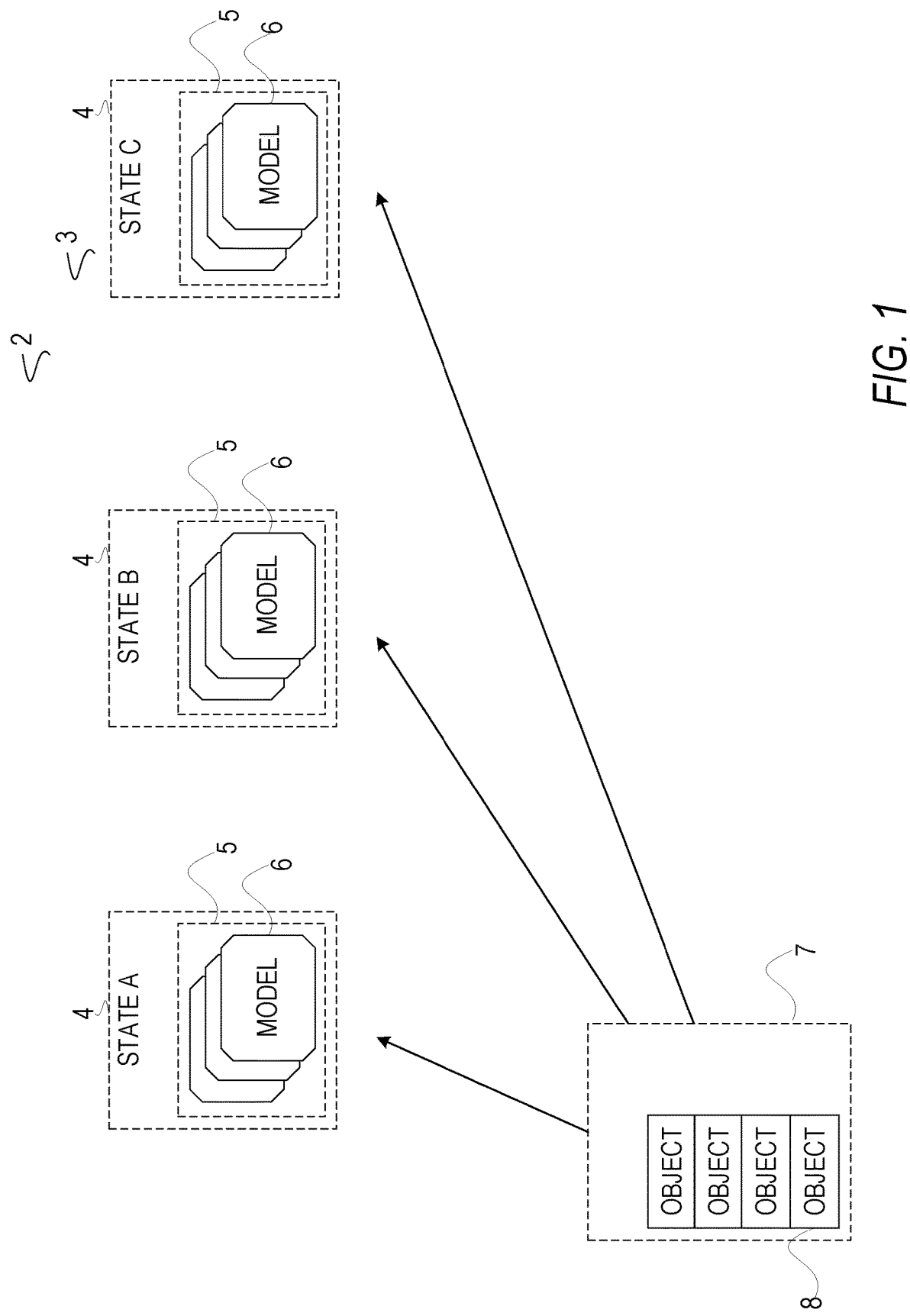
FIG. 1 is a block diagram illustrating a system in the prior art.

FIG. 1 is a block diagram illustrating a technical problem 2. The technical problem 2 is how to facilitate an ordered customization and proliferation of state models where each model comprises logic that receives and processes input to generate output in the form of a prediction. The technical problem may be illustrated with a set of states 3, such as "State A," "State B," and "State C," where each state 4 includes a set of models 5. Each model 6 is used to process a set of objects 7 through its respective state 4 to simulate an intermediate prediction that is combined with other intermediate predictions to simulate a final prediction. Here, the inputs and outputs associated each state 4 are not defined. Also, the flow of data from one state 4 to the next state 4 is not specified. The lack of definition and specification enables greater flexibility to customize a model 6; however, it also contributes towards an unwieldly customization and proliferation of the models 6 within a state and towards an inability of the models 6 of one state 4 to interoperate with the models 6 of another state 4. For example, the set of states 3 may be utilized to predict the total cost of painting a home and each state 4 may model an intermediate prediction. The set of states 3 may include "State A" to predict an availability and cost of paint, "State B" to predict an availability and cost of labor, and "State C" to predict a cost of equipment. In this example, each model 6 associated with "State A" may be authored by a different paint supplier (e.g., "Kelly Moore Paints," "Sherwin Williams," "Home Depot," etc.); each model 6 associated with "State B" may be authored by a different painting contractor (e.g., "Contractor X," "Contractor Y," "Contractor Z," etc.); and each model 6 associated with "State C" may be authored by a different equipment provider (e.g., "Equipment Provider A," "Equipment Provider B," "Equipment Provider C," etc.). Further, each object 8 may correspond to a structure that requires painting and be associated with parameters that describe the structure (e.g., type of material in surface to be painted—wood, metal, stucco, etc.; dimensions of painting surfaces; architecture of structure—single level, double level, triple level, etc.). Here, the paint suppliers, paint contractors, and equipment providers may customize their respective models 6 to simulate intermediate predictions that combine with intermediate predictions to predict the total cost of painting the structure. Nevertheless, the paint suppliers, painting contractors, and equipment providers may require slightly different inputs to enable their model to make a prediction. Further, each of the intermediate predictions may model predictions in different units. Further, the intermediate predictions may not be independent. For example, the cost of the labor may be increased based on a limited availability of the paint. Accordingly, a technical problem arises, of how to facilitate an ordered customization and proliferation of state models.

Figure 2:
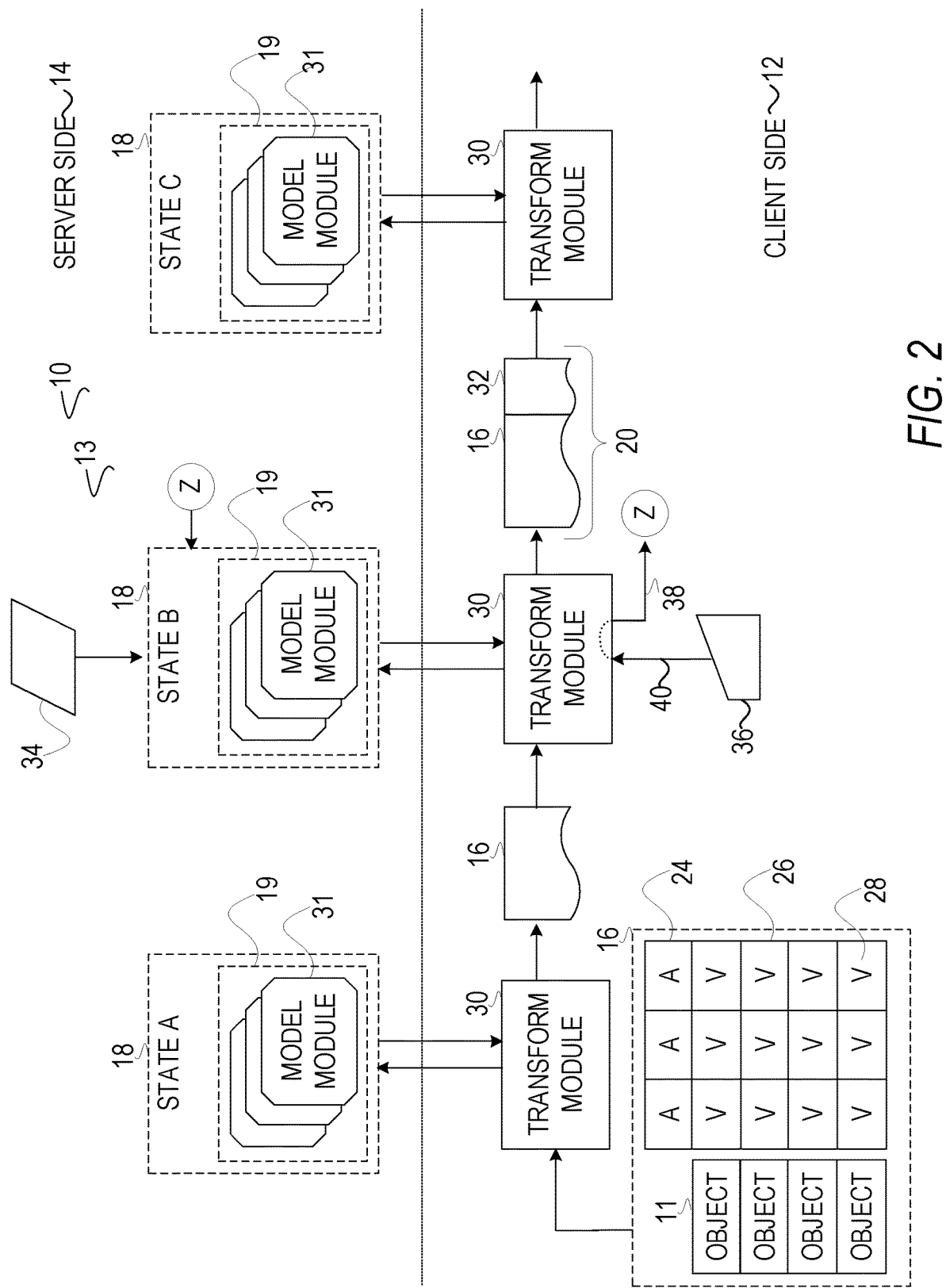
FIG. 2 is a block diagram illustrating a system, according to an embodiment, to facilitate the customization and proliferation of state models.

FIG. 2 is a block diagram illustrating a system 10, according to an embodiment, to facilitate customization and proliferation of state models and to provide a technical solution to the technical problem 2. The system 10 may be embodied as a state machine that processes objects 11 through a sequence of states 13. The system 10 includes a client side 12 and a server side 14. The client side 12 and the server side 14 are separated by a horizontal dotted line bisecting the middle of the diagram. The client side 12 includes software components illustrated below the dotted line and the server side 14 includes software components illustrated above the dotted line. The client side 12 and the server side 14 operate according to a client-server architecture, as is known in the art. It will be appreciated that software components illustrated on the server side 14 may also, according to an embodiment, operate on the client side 12; and software components illustrated on the client side 12, according to another embodiment, may operate on the server side 14.

The system 10 receives input information, as illustrated on the lower left client side 12, in the form of data frame (e.g., table information 16) that is variable in length. The system 10 processes the table information 16, from left to right, through the sequence of states 13, respectively corresponding to "State A," "State B," and "State C," as illustrated towards the top of the diagram. Each state 18 includes policy information 19 (e.g., model modules) that processes the table information 16 through the state 18 to generate output information in the form of an appended data frame (e.g., appended table information 20), as illustrated in the middle of the diagram. The table information 16 may include columns 24 corresponding to attributes and rows 26 corresponding to objects 11. The intersection of the rows 26 and the columns 24 correspond to cells storing values 28, describing the objects 11 according to their attributes. The composite states and their particular sequence are sometimes referred to as a pipeline and the processing of the input information through each of the states to generate the output information is sometimes referred to as pipelining.

At each state, on the client side 12, the system 10 includes a transform module 30 that includes multiple interfaces (not shown). Broadly, a transform module 30 associated with a state 18 performs operations to: 1) receive, via an interface, table information 16 from the transform module 30 of the previous state, 2) communicate, via an interface, the table information 16 to the policy information 19 (e.g., model modules) associated with the state 18, 3) receive, via an interface, output information from the policy information 19 (e.g., model modules), and 4) communicate, via an interface, the table information 16 and the output information to the transform module 30 in the next state.

The interfaces of the transform module 30 specify a set of predetermined attributes that respectively describe input attributes characterizing input values and output attributes characterizing output values. For example, an interface associated with the transform module 30 may include predetermined input attributes that correspond to the columns 24 in the table information 16. Further for example, an interface associated with the transform module 30 may include a predetermined output attribute that corresponds to a column of predicted values 32 appended to the table information 16. More specifically, the transform module 30 associated with "State B" may utilize an interface to receive the table information 16 from the transform module 30 associated with "State A," an interface to communicate the table information 16 to a model module 31 associated with "State "B," an interface to receive a column of predicted values 32 from the model module 31 associated with "State B," and an interface to communicate appended table information 20 (e.g., table information 16 and column of predicted values 3) to the transform module 30 associated with "State C." Accordingly, the transform module 30 for "State B" utilizes an interface that predetermines the input values it receives from the previous state (e.g., "State A") and an interface that predetermines the output values it communicates to the next state (e.g., "State C").

The system 10 further includes configuration information 34 and override information 36. The configuration information 34 and the override information 36 may be configured for each state 18 by an administrator. The configuration information 34 may be configured to include one or more of attribute-value pairs that are read at runtime by a model module 31 and utilized by the model module 31 to process the table information 16. The override information 36 may be configured for each state to be read at runtime by the transform module 30 and utilized by the transform module 30 in two ways. First, the transform module 30 may receive the override information 36, at operation 40, and communicate the override information 36, at operation 38, to the model module 31 of the same state 18 that, in turn, utilizes the override information 36 to overlay the configuration information 34, as described further below. Second, the transform module 30 may receive the override information 36, at operation 40, and apply the override information 36 (not shown) to the column of predicted values 32, as described further below. As before, the transform module 30, in each state, utilizes an interface to predetermine the input values (e.g., override information 36) it receives and an interface that predetermines the output values (e.g., override information 36) it communicates. The interfaces are described in further detail later in this document. For brevity, the configuration information 34 and the override information 36 are not illustrated in association with "State A" and "State C."

Accordingly, the technical problem of how to design a state machine to facilitate an ordered customization and proliferation of state models is technically solved by using a common software construct to predetermine the input values and the output values within a state 18 (e.g., vertical harmonization) and to predetermine the input values and the output values between states 8 (e.g., horizontal harmonization). In one embodiment, predetermination of a value may include the name, type, and size of the value, as described later.

Predetermination of the input values and the output values within a state 18 is achieved with interfaces included in a common software construct. For example, the system 10 may include the transform module 30 associated with "State B" to include one or more output interfaces that are used to communicate predetermined output values to the model modules 31 associated with "State B" and an input interface that is used to receive a predetermined input value from the model modules 31 associated with "State B." Accordingly, each of the model modules 31 associated with "State B" are authored in accordance with a predetermined input value and predetermined output values to facilitate an ordered customization and proliferation of the model modules 31 associated with "State B."

Predetermination of the input values and the output values between states 18 is achieved with interfaces included in the common software construct. For example, the transform module 30 associated with "State B" may include an input interface to receive predetermined input values from the transform module 30 associated with "State A" and an output interface to communicate predetermined output values to the transform module 30 associated with "State C." Accordingly, each of the model modules 31 for "State A" "State B," and "State C" are authored in accordance with predetermined input values that are received by the transform module 30 associated with "State B" from the transform module 30 associated with "State A" and with predetermined output values that are communicated by the transform module 30 associated with "State B" and received by the transform module 30 associated with "State C." Authoring the model modules 31 associated with "State A" "State B," and "State C" in accordance with the aforementioned predetermined input values and the predetermined output values facilitates an ordered customization and proliferation of the model modules 31 between states. Accordingly, the technical problem of how to design a state machine to facilitate an ordered customization and proliferation of state models is technically solved by using a common software construct (e.g., transform module 30 including interfaces) to predetermine the input values and the output values within a state 18 (e.g., vertical harmonization) and to predetermine the input values and the output values between states 8 (e.g., horizontal harmonization).

Figure 3:
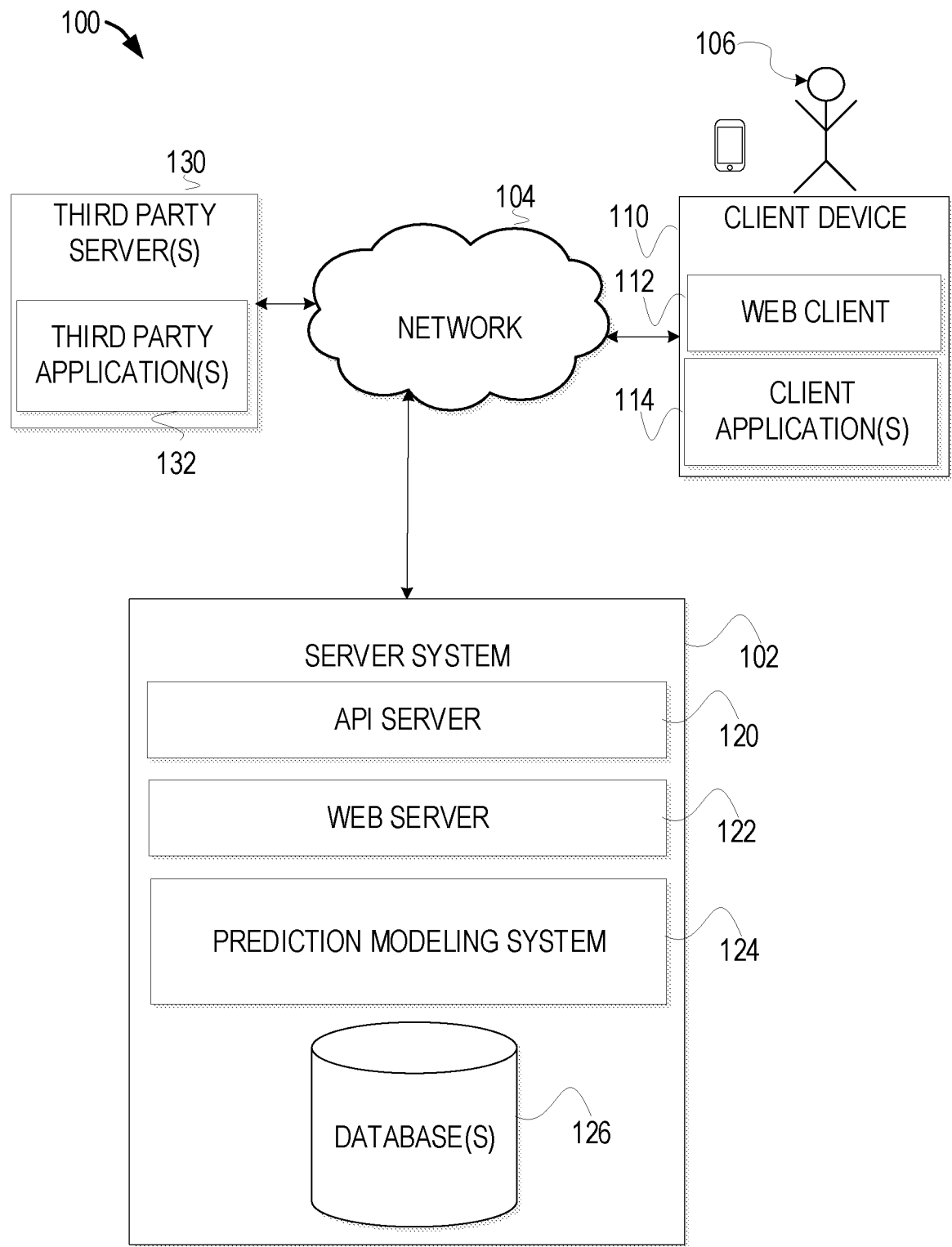
FIG. 3 is a block diagram illustrating a networked system, according to an embodiment.

FIG. 3 is a block diagram illustrating a networked system 100, according to example embodiments. The network networked system 100 may embody the system 10 to facilitate the customization and proliferation of state models. According to one embodiment, the network system 100 may be configured to simulate projections for negotiation loss, price drop slope, markup, and other aspects of home buying and selling. In one example, the system 100 is a networked system that is utilized for an online simulation of the buying and selling of homes. The projected simulations may be used to identify a value to offer to a homeowner to buy their home, a fee to charge a homeowner to buy their home, a price drop slope, a fair market valuation of the home, a list price for the home, and so forth. The system 10 and the system 100 may be embodied as the online home selling system offered by Opendoor Labs Inc. of San Francisco, California, "[t]he easiest way to sell your home."

The system 100 include one or more client devices such as client device 110. The client device 110 may comprise, but is not limited to, a mobile phone, desktop computer, laptop, portable digital assistants (PDA), smart phone, tablet, ultrabook, netbook, laptop, multi-processor system, microprocessor-based or programmable consumer electronic, game console, set-top box, computer in a vehicle, or any other communication device that a user may utilize to access the networked system 100. In some embodiments, the client device 110 may comprise a display module (not shown) to display information (e.g., in the form of user interfaces). In further embodiments, the client device 110 may comprise one or more of touch screens, accelerometers, gyroscopes, cameras, microphones, global positioning system (GPS) devices, and so forth. The client device 110 may be a device of a user that is used to access and utilize home buying services. For example, the client device 110 may be used to input information to request an offer on a home, to make an offer on a home, to receive and display various information about a home or a market, and so forth.

One or more users 106 may be a person, a machine, or other means of interacting with the client device 110. In example embodiments, the user 106 may not be part of the system 100, but may interact with the system 100 via the client device 110 or other means. For instance, the user 106 may provide input (e.g., touch screen input or alphanumeric input) to the client device 110 and the input may be communicated to other entities in the system 100 (e.g., third-party servers 130, server system 102, etc.) via the network 104. In this instance, the other entities in the system 100, in response to receiving the input from the user 106, may communicate information to the client device 110 via the network 104 to be presented to the user 106. In this way, the user 106 may interact with the various entities in the system 100 using the client device 110.

The system 100 further includes a network 104. One or more portions of network 104 may be an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the public switched telephone network (PSTN), a cellular telephone network, a wireless network, a WiFi network, a WiMax network, another type of network, or a combination of two or more such networks.

The client device 110 may access the various data and applications provided by other entities in the system 100 via web client 112 (e.g., a browser, such as the Internet Explorer® browser developed by Microsoft® Corporation of Redmond, Washington State) or one or more client applications 114. The client device 110 may include one or more client applications 114 (also referred to as "apps") such as, but not limited to, a web browser, messaging application, electronic mail (email) application, an e-commerce site application, a mapping or location application, an online home buying and selling application, a real estate application, and the like.

In some embodiments, one or more client applications 114 may be included in a given one of the client device 110, and configured to locally provide the user interface and at least some of the functionalities, with the client application 114 configured to communicate with other entities in the system 100 (e.g., third-party servers 130, server system 102, etc.), on an as needed basis, for data and/or processing capabilities not locally available (e.g., access location information, access market information related to homes, to authenticate a user 106, to verify a method of payment, etc.). Conversely, one or more applications 114 may not be included in the client device 110, and then the client device 110 may use its web browser to access the one or more applications hosted on other entities in the system 100 (e.g., third-party servers 130, server system 102, etc.).

A server system 102 may provide server-side functionality via the network 104 (e.g., the Internet or wide area network (WAN)) to one or more third-party servers 130 and/or one or more client devices 110. The server system 102 may include an application program interface (API) server 120, a web server 122, and a prediction modeling system 124, that may be communicatively coupled with one or more databases 126.

The one or more databases 126 may be storage devices that store data related to users of the system, applications associated with the system, cloud services, housing market data, and so forth. The one or more databases 126 may further store information related to third-party servers 130, third-party applications 132, client devices 110, client applications 114, users 106, and so forth. In one example, the one or more databases 126 may be cloud-based storage.

The server system 102 may be a cloud computing environment, according to some example embodiments. The server system 102, and any servers associated with the server system 102, may be associated with a cloud-based application, in one example embodiment.

The prediction modeling system 124 may provide backend support for third-party applications 132 and client applications 114, which may include cloud-based applications. The prediction modeling system 124 may process requests for offers for one or more homes, offers for homes, request for housing market information, and so forth. The prediction modeling system 124 may comprise one or more servers or other computing devices or systems.

The system 100 may further include one or more third-party servers 130. The one or more third-party servers 130 may include one or more third-party application(s) 132. The one or more third-party application(s) 132, executing on third-party server(s) 130, may interact with the server system 102 via API server 120 via a programmatic interface provided by the API server 120. For example, one or more the third-party applications 132 may request and utilize information from the server system 102 via the API server 120 to support one or more features or functions on a website hosted by the third party or an application hosted by the third party. The third-party website or application 132, for example, may provide software version analysis functionality that is supported by relevant functionality and data in the server system 102.

Figure 4A:
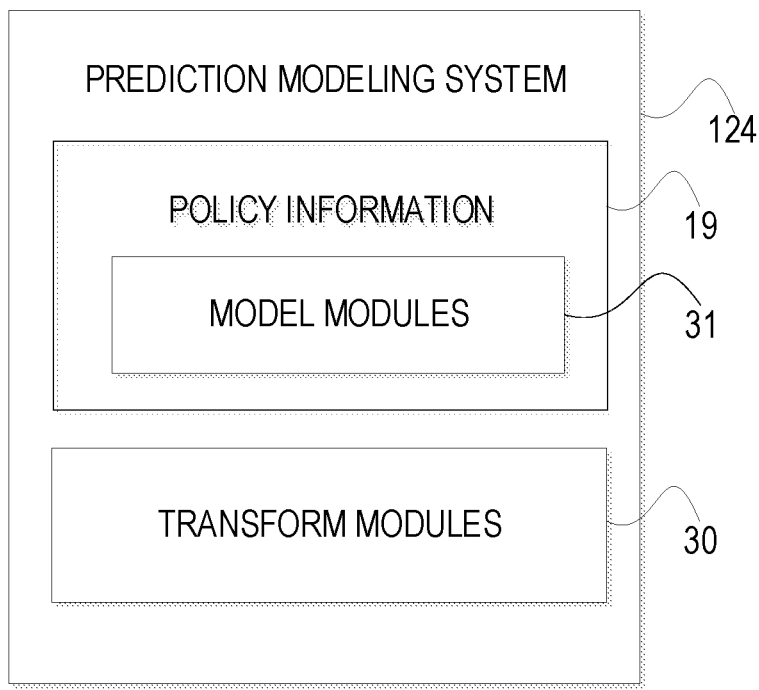
FIG. 4A is a block diagram illustrating a prediction modeling system, according to an embodiment.

FIG. 4A is a block diagram illustrating a prediction modeling system 124, according to an embodiment. The prediction modeling system 124 may embody the system 10 to facilitate the customization and proliferation of state models, according to an embodiment. The prediction modeling system 124 may include policy information 19 and transform modules 30. The policy information 19 may include a set of model modules 31 and a single transform module 30 for each state 18. At runtime, at each state 18, the transform module 30, associated with the state 18, selects a single model module 31 from a set of model modules 31, associated with the state 18, to process the table information 16. For example, the transform module 30, associated with "State B," may select a model module 31 from a set of model modules 31 associated with "State B" to perform simulation for "State B." According to one embodiment, the transform module 30, associated with a state 18, may select the model module 31 based on a set of registers or based on selection information, described later. For example, the registers and/or the selection information may be configured before running the prediction modeling system 124. In another embodiment, the registers and/or selection information may be configured responsive to the prediction modeling system 124 pausing at the initiation of a state 18.

Each model module 31 may include logic that receives and processes table information 16, configuration information 34, and override information 36 to generate a column of predicted values 32. In addition, each model module 31 within a state 18 communicates the column of predicted values 32 to the corresponding transform module 30 within the state 18. The model module 31 may include a machine learning model that makes predictions in the form of the column of predicted values 32 (not shown). The machining learning models may include artificial neural networks, decision trees, support vector machines, Bayesian networks, genetic algorithms, and so forth, according to embodiment. The machining learning models may use different approaches including supervised learning, unsupervised learning, reinforcement learning, feature learning, sparse dictionary learning, anomaly detection, association rules, and the like.

Each transform module 30 is associated with a state 18. The transform module 30 associated with a particular state 18 utilizes an interface to communicate with the transform module 30 associated with the previous state 18 and an interface to communicate with the transform module 30 associated with the next state 18. In addition, the transform module 30 associated with a particular state 18 utilizes an interface to communicate with any of the model modules 31 associated with the state 18. In addition, the transform module 30 associated with a particular state utilizes an interface to receive override information 36 and an interface to communicate the override information 36 to any of the model modules 31 associated of the state 18. The interfaces predetermine the inputs and outputs processed by the model modules 311 associated with the state to facilitate the customization and proliferation of the model modules 31.

Figure 4B:
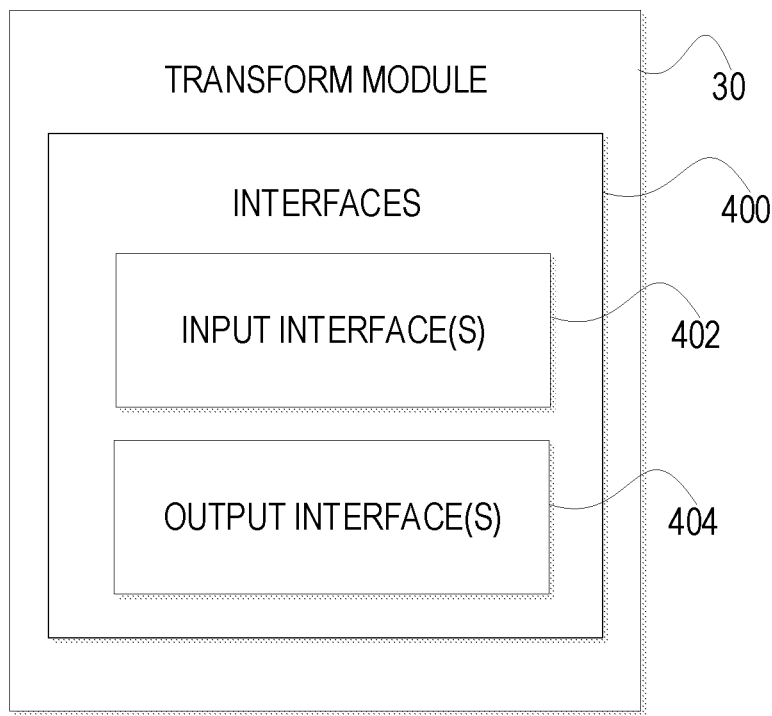
FIG. 4B is a block diagram illustrating a transform module, according to an embodiment.

FIG. 4B is a block diagram illustrating a transform module 30, according to an embodiment. The transform module 30 includes interfaces 400 that predetermine the input received by the transform module 30 and predetermines the output communicated by the transform module 30. The predetermination of the input and the output facilitates the customization and proliferation of state models (e.g., model modules 31) as users (e.g., designers) are forced to design logic in accordance with the predetermined input and output. The interfaces 400 include input interfaces 402 and an output interfaces 404, according to an embodiment. The input interfaces 402 may be utilized to receive input into the transform module 30. For example, one input interface 402 may be utilized to receive table information 19 and another input interface 402 may be utilized to receive override information 36. The output interface 404 may be utilized to communicate output from the transform module 30. For example, one output interface 404 may be utilized to communicate table information 19; another output interface 404 may be utilized to communicate appended table information 19; and another output interface 404 may be utilized to communicate override information 36.

Figure 4C:
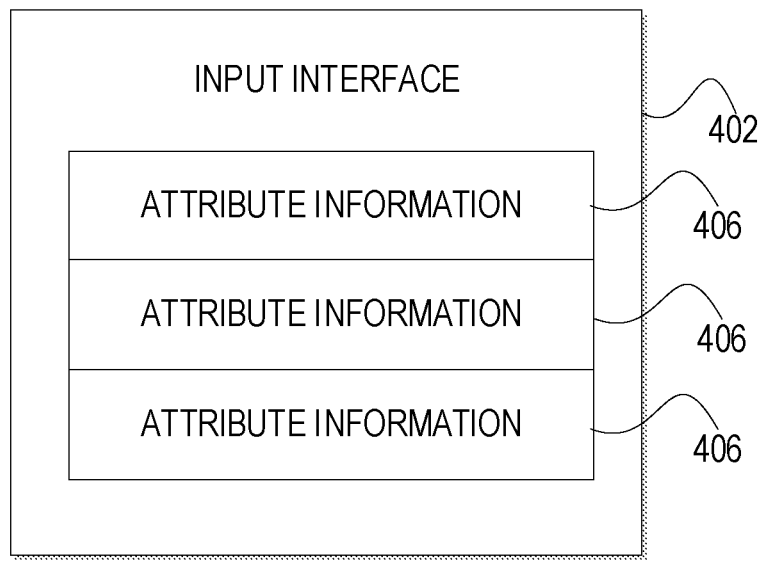
FIG. 4C is a block diagram illustrating an input interface, according to an embodiment.

FIG. 4C is a block diagram illustrating an input interface 402, according to an embodiment. The input interface 402 is comprised of one or more entries of attribute information 406. Each attribute information 406 for the input interface 402 describes an input value, as described below.

Figure 4D:
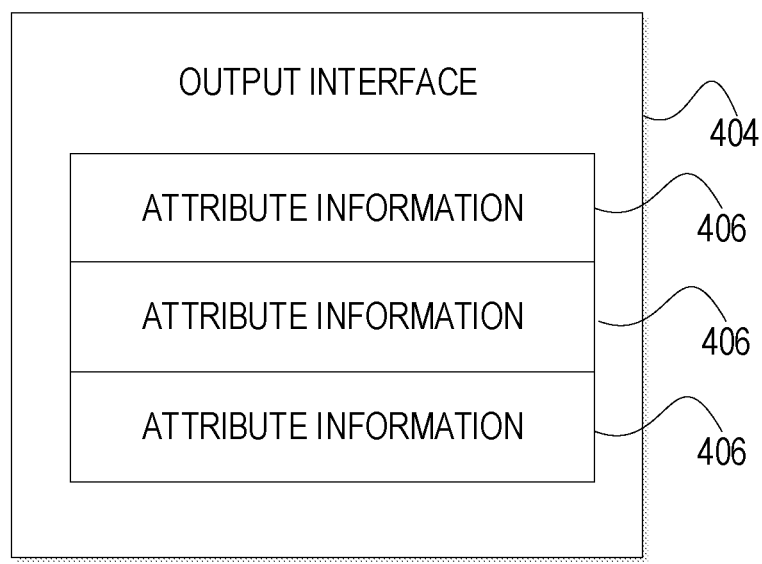
FIG. 4D is a block diagram illustrating an output interface, according to an embodiment.

FIG. 4D is a block diagram illustrating an output interface 404, according to an embodiment. The output interface 404 is comprised of one or more entries of attribute information 406. Each attribute information 406 in the output interface 404 describes an output value, as described below.

Figure 4E:
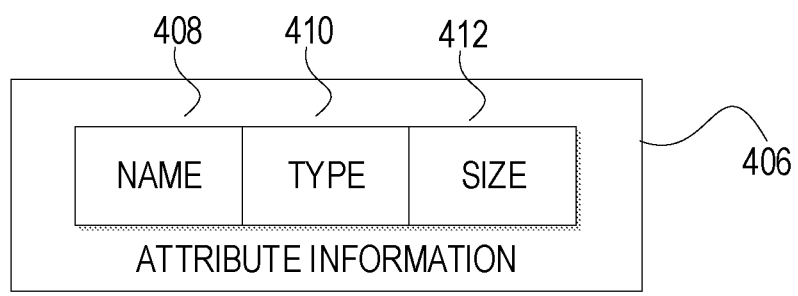
FIG. 4E is a block diagram illustrating attribute information, according to an embodiment.

FIG. 4E is a block diagram illustrating attribute information 406, according to an embodiment. The attribute information 406 is comprised of a name 408, a type 410, and a size 412 that characterizes a value. For example, the name 408, the type 410, and the size 412 may characterize an output value that is communicated by a transform module 30. Further for example, the name 408, the type 410, and the size 412 may characterize an input value that is received by a transform module 30.

FIG. 4F is a block diagram illustrating an example 420, according to an embodiment. The example 420 illustrates an input interface 402 that is utilized by a transform module 30 associated with a state 18 that is utilized to model a price drop. For example, the input interface 402 illustrated by example 420 may be utilized by the transform module 30 to receive table information 16 from a transform module 30 associated with a previous state 18. The example 420 includes rows corresponding to attribute information 406. The attribute information 406 describes a name 408, type 410, and size 412 of the respective value. For example, the names 408 may include "OBJECT IDENTIFIER," "LIST DATE," "INVENTORY WEEK," "INITIAL LIST PRICE,"

"CONDITION DATE" and "CURRENT LIST PRICE." The type 410 may include an alphanumeric type, a date type, or a currency type. Other types may be used. The size 412 may include a numeric in accordance with a particular unit (e.g., byte, etc.) and describes the size of the value.

FIG. 4G is a block diagram illustrating an example 430, according to an embodiment. The example 430 illustrates an output interface 404 that is utilized by a transform module 30, associated with a state 18, to model a price drop. The output interface 404 may be utilized by the transform module 30 to communicate appended table information 20 to a transform module 30 associated with a subsequent state 18. The example 430 includes rows corresponding to attribute information 406, as in example 420. In addition, the example 430 includes attribute information 406 describing the column of predicted values 32 (e.g., "LIST PRICE").

FIG. 5A is a block diagram illustrating table information 16, according to an embodiment. The table information 16 may be embodied as a price drop table 500, according to an embodiment. The price drop table 500 may be used by a state machine to simulate a price drop for a home. The price drop table 500 may include rows 26 and columns 24. Each row 26 corresponds to an event for a house. For example, the first two events are for a house "A" and the next three events are for a house "B." Each column 24 corresponds to an attribute. The intersection of the rows 26 and the columns 24 store values 28 describing the house events according to the attributes.

The attributes in the price drop table 500 correspond to the attribute information 406 in an interface 400. For example, the attributes in the price drop table 500 may correspond to the attribute information 406 in the input interface 402 utilized by a transform module 30 associated with a current state 18 (e.g., "State B"). Continuing with the example, the transform module 30 associated with the current state 18 (e.g., "State B") may utilize the input interface 402 to receive the table information 16 (e.g., price drop table) from a transform module 30 associated with a previous state (e.g., "State A"). The attributes in the price drop table 500 may include an object identifier 502, a list date 504, an inventory week 506, an initial list price 508, a condition date 510, and current list price 512. The object identifier 502 may uniquely identify a house. The list date 504 may identify a date the house was listed for sale. The inventory week 506 may identify the house for the designated week. The initial list price 508 may identify the price at which the home was initially listed.

The condition date 510 and the current list price 512 may specify events (rows) that do not need to be simulated with the modeling module 31 in the price drop policy state 18. For example, home B is shown to have a $50K price drop in the week of 2019_6_8 (e.g., $500K to $450K). This known fact is presented as "conditioned information" in the price drop table 500 at the start of the pipeline (e.g., see "State A" in FIG. 2). Accordingly, the event associated with home B in the week of 2019_6_8 does not need to be simulated with the modeling module 31 to generate a list price for the specified week because the price was known to have dropped $50K (e.g., $500K to $450K). That is, the seller may have elected to lower the price. This is illustrated in the next figure.

FIG. 5B is a block diagram illustrating appended table information 20, according to an embodiment. The appended table information 20 may be embodied as an appended price drop table 520, according to an embodiment. The appended price drop table 520 includes the same attributes as price drop table 500 and further includes an additional attribute, namely, a list price 514. The list price 514 is the right most column on the appended price drop table 520. The list price 514 embodies the column of predicted values 32 appended to the table information 16 by the transform module 30. Here, the model module 31 simulates a price drop of $5K in the list price 514 for each week excluding the event describing house "B" in the week of 2019_6_8 including the "conditioned information." The attributes in the appended price drop table 520 correspond to the attribute information 406 in an interface 400. For example, the attributes in the appended price drop table 520 correspond to the attribute information 406 in the output interface 404 utilized by a transform module 30 associated with a current state 18 (e.g., "State B"). Continuing with the example, the transform module 30 associated with the current state 18 (e.g., "State B") may utilize the output interface 404 to communicate appended table information 20 (e.g., appended price drop table) to a transform module 30 associated with a subsequent state (e.g., "State C").

Figure 6A:
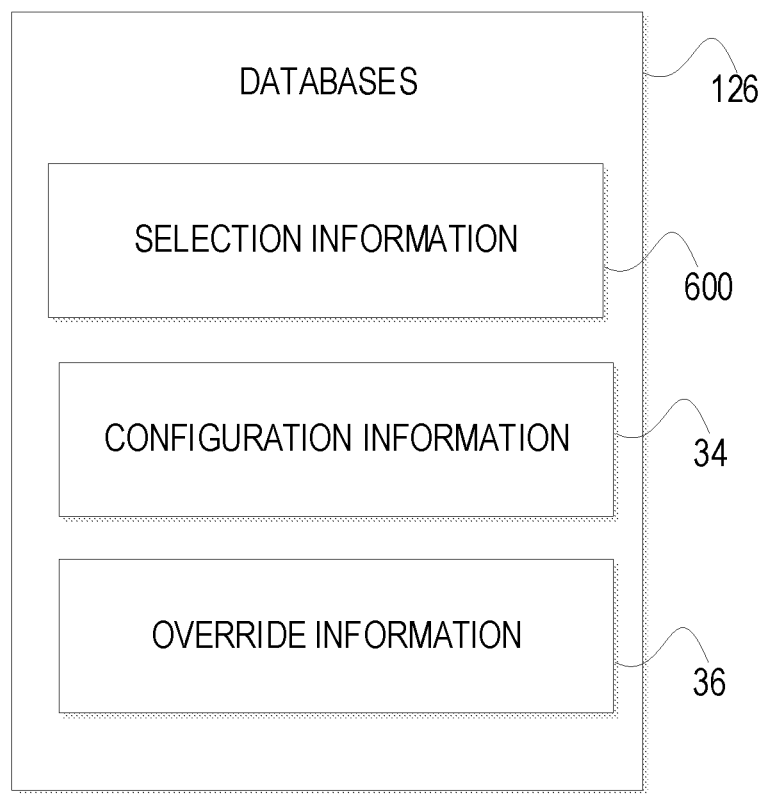
FIG. 6A is a block diagram illustrating databases, according to an embodiment.

FIG. 6A is a block diagram illustrating databases 126, according to an embodiment. The databases 126 include selection information 600, configuration information 34 and override information 36. The selection information 600, the configuration information 34 and the override information 36 may be configured for each state 18. The selection information 600 may be utilized by the prediction modeling system 124 to select policy information for a state 18. For example, the prediction modeling system 124 may select a single model module 31 from a set of model modules 31 associated with a state 18 (e.g., price drop state). The model module 31 selected by the prediction modeling system 124 executes responsive to communication of the table information 16 to the server side 14 of the state machine. For example, consider a state machine including an "X," "Y," and "Z" model modules 31 associated with a "State A" and selection information 600 being configured for the model module 31 named "X." Accordingly, an iteration of the state machine includes the prediction modeling system 124 selecting the "X" model module 31 based on the selection information 600 and executing the "X" model module 31 responsive to the transform module 30 communicating the table information 16 to the model module 31 for "State B."

The configuration information 34 may include multiple sets of configuration information 34. For example, the configuration information 34 may include a set of configuration information 34 for each state 18 in a state machine. The configuration information 34 for a state 18 may include one or more sets of attribute-value pairs. The attribute-value pairs for a particular state may be utilized by a model module 31 to generate the column of predicted values 32 for the state.

The override information 36 may include multiple sets of override information 36. For example, the override information 36 may include a set of override information 36 for each state 18 in a state machine. The override information 36 for a state 18 may include one or more sets of attribute-value pairs. The attribute-value pairs for a particular state may be utilized by a transform module 31 to override configuration information 34 associated with the state or to apply a function to the values in the column of predicted values 32, as previously described.

Figure 6B:
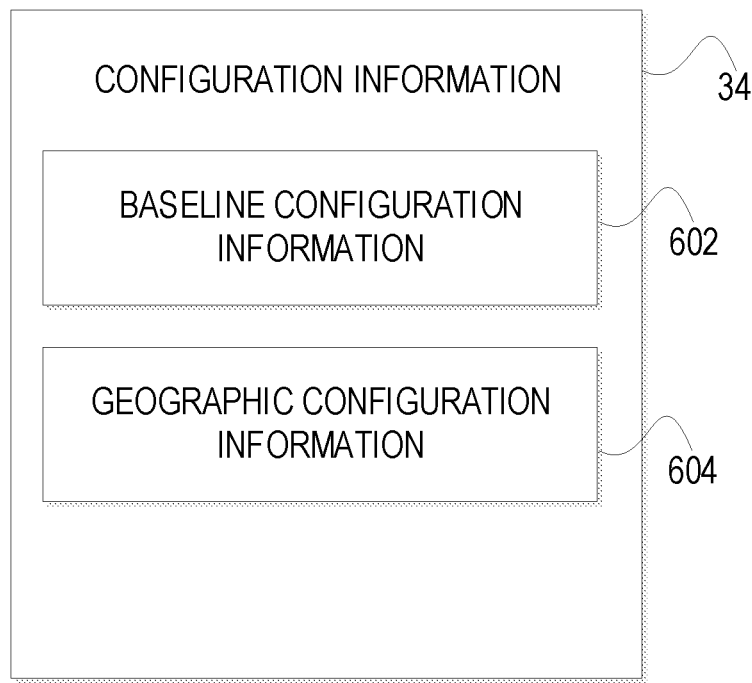
FIG. 6B is a block diagram illustrating configuration information, according to an embodiment.

FIG. 6B is a block diagram illustrating configuration information 34, according to an embodiment. The configuration information 34 may include baseline configuration information 602 and geographic configuration information 604. The baseline configuration information 602 may include baseline attribute-value pairs and the geographic configuration information 602 may include geographic attribute-value pairs. The baseline attribute-value pairs may be utilized for an object that is identified as not being included within the boundary of a geographic area associated with a set of the geographic attribute-value pairs. For example, the model module 31 may be utilized a first set of geographic attribute-value pairs to override the baseline attribute-value pairs responsive to identifying an object (e.g., house event) that is located inside a first geographic area that is associated with the first set of geographic attribute-value pairs. Further for example, a set of geographic attribute-value pairs may be associated with the city of CITY-A and the model module 31 may override the baseline attribute-value pairs with the geographic attribute-value pairs responsive to identifying a house event with a zip code located inside the city limits of CITY-A. An example of baseline attribute-value pair may include the attribute "baseline daily price drop pace" and the value "−0.01." An example of geographic attribute-value pair may include the attribute "CITY-A: baseline daily price drop pace" and the value "−0.02." If the model module 31 identifies a house event as being associated with a zip code located inside the city limits of CITY-A, then the model module 31 overrides the baseline daily price drop pace" value of "−0.01" with the with the "CITY-A: baseline daily price drop pace" value of "−0.02." In this example, the model module 31 simulates a price drop based on the value of "−0.02."

Figure 6C:
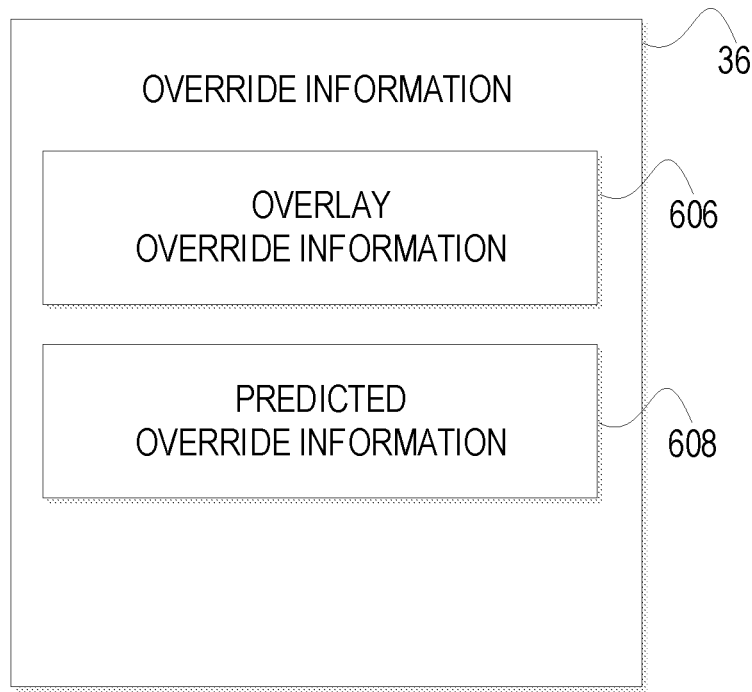
FIG. 6C is a block diagram illustrating override information, according to an embodiment.

FIG. 6C is a block diagram illustrating override information 36, according to an embodiment. The override information 36 may include overlay override information 36 and predicted override information 36. The overlay override information 606 may be utilized by the model module 31 to overlay corresponding configuration information 34. For example, the overlay override information 606 may include an attribute-value pair, "baseline daily price drop pace"— "−0.01," that corresponds to the same attribute-value pair, "baseline daily price drop pace"—"−0.01" in the configuration information 34 (e.g., baseline configuration information 602 or geographic configuration information 604). Continuing with the example, the value, "−0.01," in the overlay override information 606, may be utilized by the model module 31 to override the value, "−0.01," in the configuration information 34 (e.g., baseline configuration information 602 or geographic configuration information 604).

The predicted override information 36 may be utilized by the transform module 30 to modify the column of predicted values 32. For example, the transform module 30 may retrieve a function (e.g., scaling/multiplication) and a constant (e.g., 2) from predicted override information 36 and apply the function and the constant to the column of predicted values 32 to uniformly modify each of the values in the column of predicted values 32. For example, the transform module 30 may apply a scaling function utilizing a constant of two to multiply each of the values in the column of predicted values 32 by two. In another embodiment, the transform module 30 may apply other functions (e.g., subtraction, addition, division, cosine, sine, etc.) and other constants (1.2, 5%, etc.) to uniformly modify each of the predicted values in the column of predicted values 32.

Figure 7A:
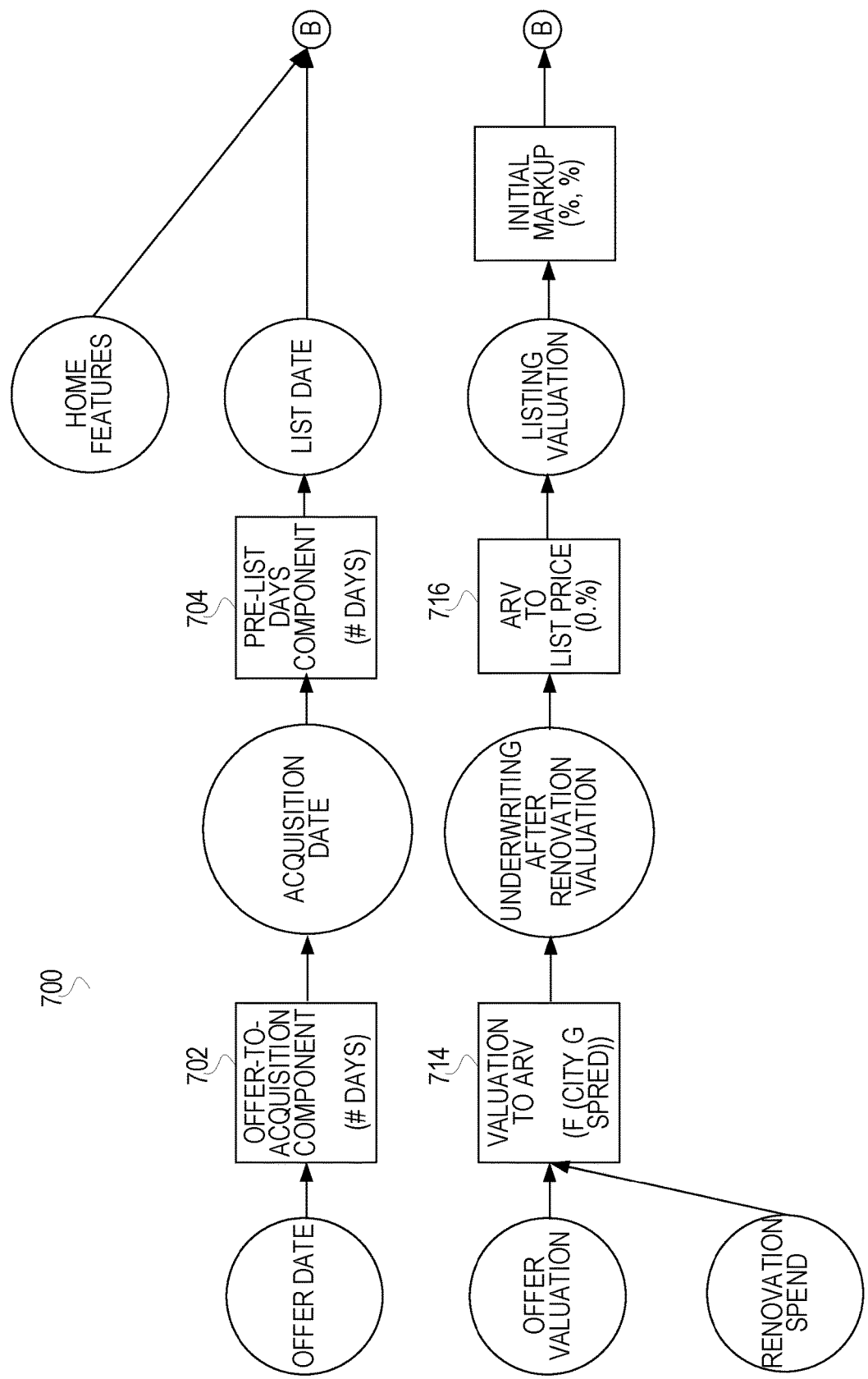
FIG. 7A is a diagram illustrating a system, according to an embodiment, for transitioning homes through a sequence of states from acquisition to resale.
Figure 7B:
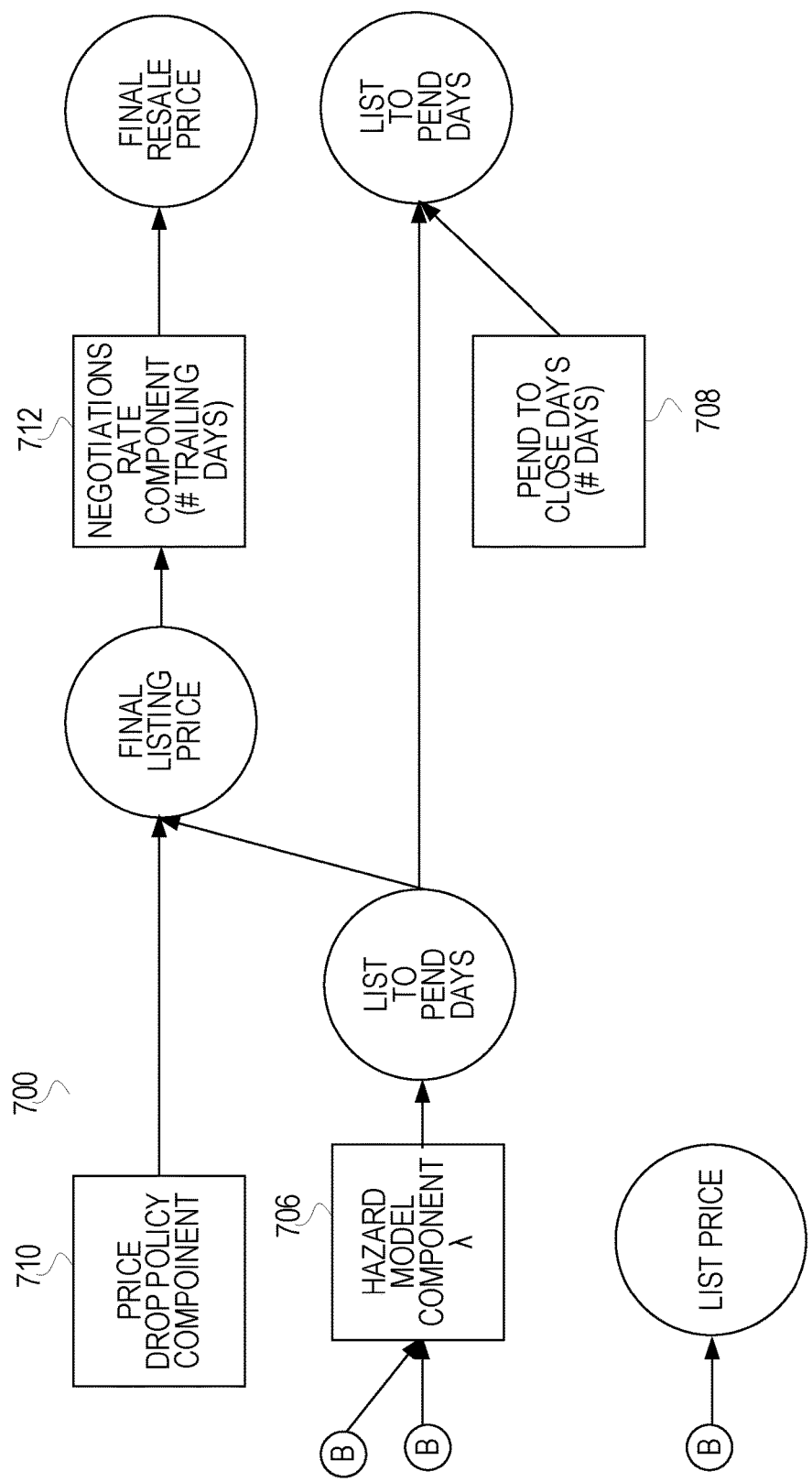
FIG. 7B is a diagram illustrating a system, according to an embodiment, for transitioning homes through a sequence of states from acquisition to resale.

FIGS. 7A and 7B are diagrams illustrating a system 700, according to an embodiment, for transitioning homes through a sequence of states from acquisition to resale. The system 700 embodies the prediction modelling system 124, according to an embodiment. In addition, the system 700 may be embodied as the system 10 to facilitate customization and proliferation of state models, as illustrated in FIG. 2, according to an embodiment. In addition, the system 700 may be embodied as the networked system 100, as illustrated in FIG. 3, according to an embodiment. The system 700 is split into FIG. 7A and FIG. 7B for readability purposes.

The prediction modeling system 124 comprises a number of data input and data output (generally indicated by circles) and components (generally indicated by squares) (e.g., model modules 31) for simulating predicted values. In one example, an offer date is input to an offer-to-acquisition component 702 (e.g., model module 31) which calculates and outputs an acquisition date (e.g., predicted value). In one example, the acquisition date is input to the pre-list days component 704 (e.g., model module 31) which outputs a list date (e.g., predicted value).

Illustrated on FIG. 7B, in one example, the list date is input into a hazard model component 706 (e.g., model modules 31) along with home features and list price, which calculates and outputs list to pending days (e.g., a number of days from when the home was listed until when the home is under contract) (e.g., predicted value). In one example, the list to pending days is used to calculate and output days on the market (e.g., predicted value). In one example, a pend to close days component 708 (e.g., model module 31) calculates days on the market (e.g., predicted value). In one example, a price drop policy component 710 (e.g., model module 31) calculates and outputs a final listing price (e.g., predicted value). In one example, a negotiations rate component 712 (e.g., model module 31), using the list to pend days and final listing prices as input, calculates and outputs a final resale price (e.g., predicted value). In one example, the negotiations rate component 712 (e.g., model module 31) calculates the negotiation loss (e.g., predicted value) using a final listing price before the home will likely sell.

The final resale price is determined by simulation of the drop in price over time based on the list to pend days (e.g., days it will take to sell the home). For example, an existing list price is $200,000 and the list to pend days, or the number of days that are predicted to sell the home, is 60 days. In this example, the price drop policy component (e.g., model module 31) (e.g., price drop model) simulates the price drop starting with $200,000 over 60 days to predict the final listing price of the home (e.g., predicted value) before selling. The negotiations rate component 712 (e.g., model module 31) utilizes the predicted final listing price and the predicted number of days to sell, and seasonality values (e.g., based on a particular month or time period in a year), to generate a negotiation loss value (e.g., predicted value). For example, the negotiations rate component 712 (e.g., model module 31) may factor a higher negotiation loss for a home that takes a longer time to sell or that is being sold in a low buying season. The negotiation loss value may be used to determine a final resale price (e.g., predicted value) and/or determine a fee (e.g., predicted value) to charge a home owner for buying the home.

Returning to FIG. 7A, in one example, an offer valuation and renovation spend is input to a valuation to after repair value (ARV) component 714 (e.g., model module 31) which calculates and outputs underwriting after renovation value (e.g., predicted value). In one example the underwriting after renovation value is input into an ARV to list price component 716 (e.g., model module 31) which calculates and outputs a listing valuation (e.g., predicted value). In one example, the listing valuation is input to the initial markup component (e.g., model module 31) which calculates and outputs the list price (e.g., predicted value).

In one example embodiment, seasonality calculations and predictions are added to projection simulations (e.g., predicted values) for each of negotiation loss, price drop slope, and markup. In one example, the system (e.g., system 100 or prediction modeling system 124) explicitly optimizes for general managers of a market (GM), operator trust and control, ability to adjust assumptions and not key result metrics (KRs) of bias and accuracy. In one example embodiment, the system applies a seasonal adjustment on top of general market data (e.g., Trailing 28 day metric (T28) in the Multiple Listing Service (MLS)) and internally derived market data factors ((e.g., Opendoor Labs Inc. (OD))× MLS), updated as part of a fee calibration. For example, a fee for selling a home (e.g., 7% or 10% of a fair market value for a home) may be determined by incorporating seasonality into one or more projections simulation of negotiation loss, price drop slope, and markup.

In one example embodiment, the system aligns with cities on reasonable seasons curves, for each of the three components (e.g., model modules 31), creates dashboards that will enable them to contextualize and set values of T28 MLS and OD×MLS factors, and support them in analysis and implementation of the factors in fee calibration.

In one example embodiment, a first set of interpretable, hardcoded seasonal coefficients are primarily motivated by MLS data. In another example, embodiments seasonal coefficients may be motivated by OD×MLS data or a combination of MLS data, OD×MLS data, or other data.

In one example an immediate fee impact is shown as follows:
CITY-A: −4 bps (driven by overperformance of negotiations loss to market by 35 bps)
CITY-B: +6 bps (driven by underperformance of negotiations loss to market of 82 bps)
CITY-C: −13 bps (driven by a hotter market, with lower negotiations loss from −150 bps down to −50 bps in the 0-60 DTP bucket, and our underperformance to market by 50 bps)
CITY-D: +1 bps
CITY-E: −12 bps
CITY-F: +20 bps (driven mostly by our underperformance to market in negotiations loss by 91 bps) The CITY-B increase is driven almost entirely by adding an OD-MLS term, where the system was underperforming the market by 82 bps.

Figure 8A:
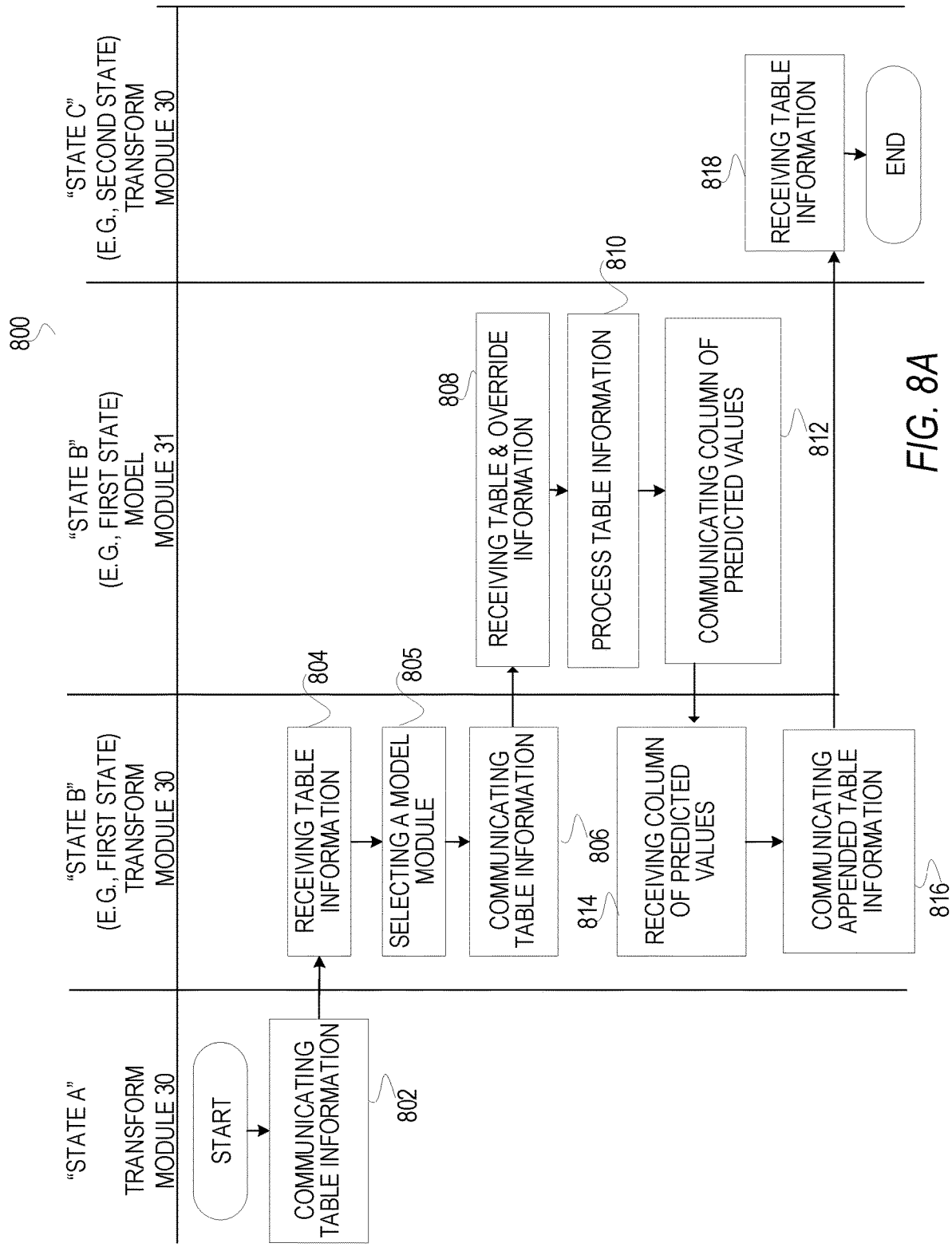
FIG. 8A is a block diagram illustrating a method, according to an embodiment, to facilitate the customization and proliferation of state models.

FIG. 8A is a block diagram illustrating a method 800, according to an embodiment, to facilitate the customization and proliferation of state models. Illustrated on the far left are operations performed by a transform module 30 associated with "State A;" illustrated on the middle left are operations performed by a transform module 30 associated with "State B;" illustrated on the middle right are operations performed by a model module 31 associated with "State B;" and illustrated on the far right are operations performed by a transform module 30 associated with "State C." The method commences at operation 802, with the transform module 30, associated with a "State A" transmitting table information 16 to a transform module 30, associated with "State B." According to one embodiment, the table information 16, itself, is transmitted. For example, the table information 16 may be transmitted as a stack variable. Further for example, the table information 16 may be transmitted as a pointer to storage that is allocated and initialized with the table information 16. Though not illustrated or described, it will be appreciated that "State A" includes substantially similar operations as are being described with respect to "State B."

At operation 804, the transform module 30, associated with "State B" receives table information 16 from the transform module 30, associated with "State A." For example, the "State B" may be utilized to simulate a price drop. The transform module 30, associated with "State B," receives the table information 16 by utilizing an input interface 402 (e.g., first interface). For example, the input interface 402 may include attribute information 406 that corresponds to the attributes associated with the columns 24 in the table information 16 (e.g., price drop table 500), as illustrated in FIG. 5A.

Figure 8B:
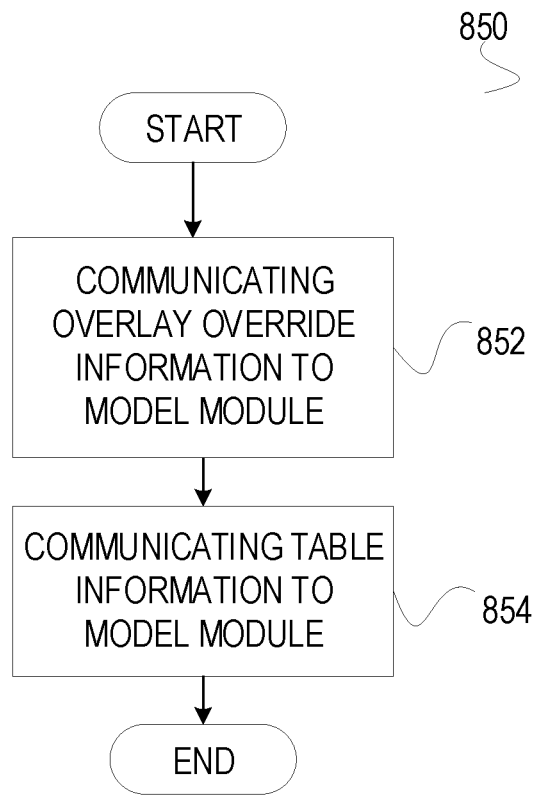
FIG. 8B is a block diagram illustrating a method, according to an embodiment, to communicate table information and overlay override information.

At operation 805, the transform module 30, associated with the state (e.g., "State B") selects a model module 31. For example, the transform module 30 may select a model module 31 from a set of model modules 31 associated with the state (e.g., "State B"), as previously described. At operation 806, the transform module 30, associated with "State B," communicates the table information 16 and overlay override information 606 to the model module 31 associated with "State B." For example, the transform module 30, associated with "State B," may communicate the table information 16 (e.g., price drop table 500) by utilizing an output interface 404 (e.g., first interface) with attribute information 406 that correspond to the attributes associated with the columns 24 in the table information 16 (e.g., price drop table 500), as illustrated in FIG. 5A. FIG. 8B describes this operation in more detail.

Figure 8C:
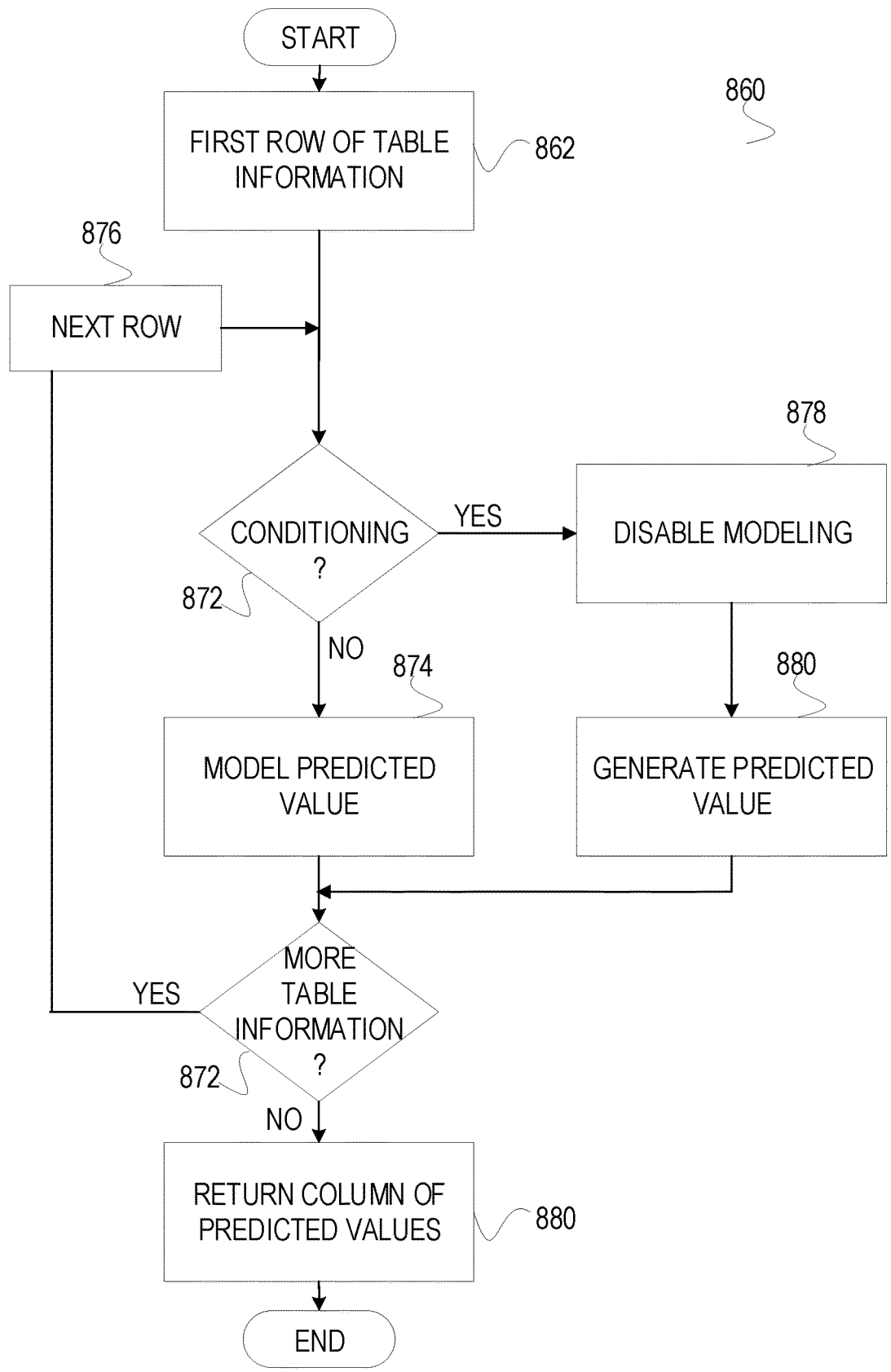
FIG. 8C is a block diagram illustrating a method, according to an embodiment, to process table information.

At operation 808, the model module 31, associated with "State B" and previously selected, receives the table information 16 and the overlay override information 606. At operation 810, the model module 31 processes the table information 16 to generate a column of predicted values 32. FIG. 8C describes this operation in more detail. At operation 812, the model module 31 communicates the column of predicted values 32 to the transform module associated with "State B."

At operation 814, the transform module, associated with "State B," utilizes an input interface 402 to receive the column of predicted values 32. For example, the transform module 30, associated with "State B," may receive the column of predicted values 32 by utilizing an input interface 404 (e.g., third interface) including attribute information 406 that corresponds to the attribute describing the column of predicted values 32 (e.g., list price 514) in the appended price drop table 520, as illustrated in FIG. 5B. In addition, at operation 814, the transform module 30 appends the column of predicted values 32 to the table information 16 to generate appended table information 20. Further, the transform module 30 may apply a function and a constant to the column of predicted values 32 based on the predicted override information 608, as previously described.

At operation 816, the transform module 30, associated with "State B," utilizes an output interface 404 to communicate the appended table information 20 to the transform module 30, associated with "State C." For example, the transform module 30 may utilize an output interface 404 (e.g., second interface) including attribute information 406 corresponding to the attributes describing the columns in the appended price drop table 520, as illustrated in FIG. 5B.

At operation 818, the transform module 30, associated with "State C," utilizes an input interface 404 to receive the appended table information 20 from the transform module 30, associated with "State B." For example, the transform module 30 associated with "State C" may utilize an input interface 404 including attribute information 406 corresponding to the attributes describing the columns in the appended price drop table 520, as illustrated in FIG. 5B.

FIG. 8B is a block diagram illustrating a method 850, according to an embodiment, to communicate table information 16 and overlay override information 606. For example, the method 850 may communicate table information 16 and overlay override information 606 to the model module 31 associated with "State B." The method 850 corresponds to the operation 806 in FIG. 8A. The method 850 commences at operation 852 with the transform module 30 communicating the overly override information 606 to the model module 31 previously selected. According to one embodiment, the transform module 30 may communicate the overly override information 606 as a stack variable to the model module 31. According to another embodiment, the transform module 30 may communicate the overly override information 606 as a pointer to allocated and initialized memory. At operation 852, the transform module 30 utilizes an output interface 404 (e.g., first interface) to communicate the table information 16 to the model module 31.

FIG. 8C is a block diagram illustrating a method 860, according to an embodiment, to process table information 16. The method 860 corresponds to operation 810 in FIG. 8A. The method 870 commences at operation 862 with the model module 31 advancing to the first row 26 of the table information 16. At decision operation 872, the model module 31, associated with the state (e.g., "State B"), identifies whether conditioning is present for an object 11 (e.g., home event) (e.g., row 26). For example, the model module 31 may identify conditioning, as described in FIG. 5A and FIG. 5B, based on a portion of the values 26 in the row 26. If the model module 31 identifies conditioning is present, then a branch is made to operation 878. Otherwise, a branch is made to operation 874.

At operation 878, the model module 31 disables modeling (e.g., simulation). At operation 880, the model module 31 generates a price drop in the form of a predicted value based on a portion of the values 26 in the row 26. According to one embodiment, the model module 31 may utilize the configuration information 34 to generate the predicted value. For example, the model module 31 may utilize the configuration information 34 to generate the predicted value as described in association with FIG. 6B. Further, for example, the model module 31 may utilize the overlay override information 606 to overlay the configuration information 34 to generate the predicted value as described in association with FIG. 6C.

At operation 874, the model module 31 models (e.g., simulates) a price drop based on values 26 in the current row. For example, the model module 31 model may simulate a price drop in the form of a predicted value based on a machine learning algorithm. In like manner as mentioned above, the model module 31 may utilize the configuration information 34 to model the predicted value. For example, the model module 31 may utilize the configuration information 34 to model the predicted value as described in association with FIG. 6B. Further, for example, the model module 31 may utilize the overlay override information 606 to overlay the configuration information 34 to model the predicted value as described in association with FIG. 6C.

At decision operation 872, the model module 31 identifies whether more rows 26 (e.g., house events) in the table information 16 need to be processed. If more rows 26 need to be processed, then a branch is made to operation 876. Otherwise, a branch is made to operation 880. At operation 876, the model module 31, advances to the next row 26 (e.g., house event). At operation 880, the model module 31 communicates a column of predicted values 32 to the transform module 30 associated with the first state.

Machine and Software Architecture

The modules, methods, engines, applications, and so forth described in conjunction with FIGS. 2-8C are implemented in some embodiments in the context of multiple machines and associated software architectures. The sections below describe representative software architecture(s) and machine (e.g., hardware) architecture(s) that are suitable for use with the disclosed embodiments.

Software architectures are used in conjunction with hardware architectures to create devices and machines tailored to particular purposes. For example, a particular hardware architecture coupled with a particular software architecture will create a mobile device, such as a mobile phone, tablet device, or so forth. A slightly different hardware and software architecture may yield a smart device for use in the "internet of things," while yet another combination produces a server computer for use within a cloud computing architecture. Not all combinations of such software and hardware architectures are presented here, as those of skill in the art can readily understand how to implement the disclosure in different contexts from the disclosure contained herein.

Software Architecture

Figure 9:
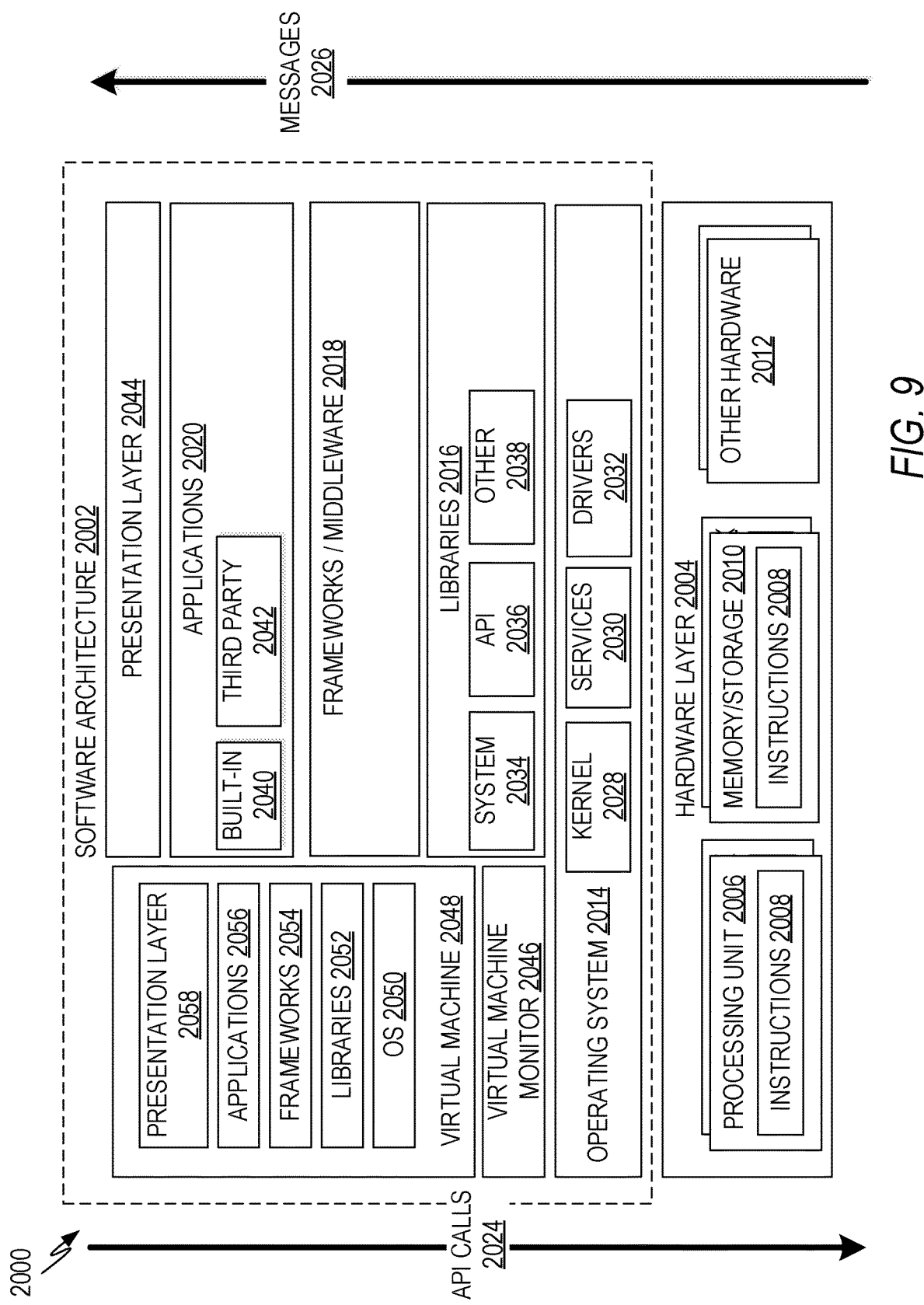
FIG. 9 is a block diagram illustrating a representative software architecture.

FIG. 9 is a block diagram 2000 illustrating a representative software architecture 2002, which may be used in conjunction with various hardware architectures herein described. FIG. 9 is merely a non-limiting example of a software architecture 2002, and it will be appreciated that many other architectures may be implemented to facilitate the functionality described herein. The software architecture 2002 may be executing on hardware such as a machine 2100 of FIG. 10 that includes, among other things, processors 2110, memory/storage 2130, and I/O components 2150. Returning to FIG. 9, a representative hardware layer 2004 is illustrated and can represent, for example, the machine 2100 of FIG. 10. The representative hardware layer 2004 comprises one or more processing units 2006 having associated executable instructions 2008. The executable instructions 2008 represent the executable instructions of the software architecture 2002, including implementation of the methods, engines, modules, and so forth of FIGS. 2-9C. The hardware layer 2004 also includes memory and/or storage modules 2010, which also have the executable instructions 2008. The hardware layer 2004 may also comprise other hardware 2012, which represents any other hardware of the hardware layer 2004, such as the other hardware 2012 illustrated as part of the machine 2100.

In the example architecture of FIG. 9, the software architecture 2002 may be conceptualized as a stack of layers where each layer provides particular functionality. For example, the software architecture 2002 may include layers such as an operating system 2014, libraries 2016, frameworks/middleware 2018, applications 2020, and a presentation layer 2044. Operationally, the applications 2020 and/or other components within the layers may invoke application programming interface (API) calls 2024 through the software stack and receive a response, returned values, and so forth, illustrated as messages 2026, in response to the API calls 2024. The layers illustrated are representative in nature, and not all software architectures have all layers. For example, some mobile or special purpose operating systems 2014 may not provide a frameworks/middleware 2018 layer, while others may provide such a layer. Other software architectures may include additional or different layers.

The operating system 2014 may manage hardware resources and provide common services. The operating system 2014 may include, for example, a kernel 2028, services 2030, and drivers 2032. The kernel 2028 may act as an abstraction layer between the hardware and the other software layers. For example, the kernel 2028 may be responsible for memory management, processor management (e.g., scheduling), component management, networking, security settings, and so on. The services 2030 may provide other common services for the other software layers. The drivers 2032 may be responsible for controlling or interfacing with the underlying hardware. For instance, the drivers 2032 may include display drivers, camera drivers, Bluetooth® drivers, flash memory drivers, serial communication drivers (e.g., Universal Serial Bus (USB) drivers), Wi-Fi® drivers, audio drivers, power management drivers, and so forth depending on the hardware configuration.

The libraries 2016 may provide a common infrastructure that may be utilized by the applications 2020 and/or other components and/or layers. The libraries 2016 typically provide functionality that allows other software modules to perform tasks in an easier fashion than to interface directly with the underlying operating system 2014 functionality (e.g., kernel 2028, services 2030, and/or drivers 2032). The libraries 2016 may include system 2034 libraries (e.g., C standard library) that may provide functions such as memory allocation functions, string manipulation functions, mathematic functions, and the like. In addition, the libraries 2016 may include API libraries 2036 such as media libraries (e.g., libraries to support presentation and manipulation of various media formats such as moving picture experts group (MPEG) 4, H.264, MPEG-1 or MPEG-2 Audio Layer (MP3), augmentative and alternative communication (AAMC), adaptive multi-rate audio codec (AMR), joint photography experts group (JPG), or portable network graphics (PNG)), graphics libraries (e.g., an Open Graphics Library (OpenGL) framework that may be used to render two dimensional (2D) and three dimensional (3D) graphic content on a display), database libraries (e.g., Structured Query Language (SQL), SQLite that may provide various relational database functions), web libraries (e.g., WebKit that may provide web browsing functionality), and the like. The libraries 2016 may also include a wide variety of other libraries 2038 to provide many other APIs to the applications 2020 and other software components/modules.

The frameworks 2018 (also sometimes referred to as middleware) may provide a higher-level common infrastructure that may be utilized by the applications 2020 and/or other software components/modules. For example, the frameworks/middleware 2018 may provide various graphic user interface (GUI) functions, high-level resource management, high-level location services, and so forth. The frameworks/middleware 2018 may provide a broad spectrum of other APIs that may be utilized by the applications 2020 and/or other software components/modules, some of which may be specific to a particular operating system 2014 or platform.

The applications 2020 include built-in applications 2040 and/or third party applications 2042. Examples of representative built-in applications 2040 may include, but are not limited to, a contacts application, a browser application, a book reader application, a location application, a media application, a messaging application, and/or a game application. Third party applications 2042 may include any of the built-in applications as well as a broad assortment of other applications 2020. In a specific example, the third party application 2042 (e.g., an application developed using the Android™ or iOS™ software development kit (SDK) by an entity other than the vendor of the particular platform) may be mobile software running on a mobile operating system 2014 such as iOS™, Android™, Windows® Phone, or other mobile operating systems 2014. In this example, the third party application 2042 may invoke the API calls 2024 provided by the mobile operating system such as the operating system 2014 to facilitate functionality described herein.

The applications 2020 may utilize built-in operating system functions (e.g., kernel 2028, services 2030, and/or drivers 2032), libraries (e.g., system libraries 2034, API libraries 2036, and other libraries 2038), and frameworks/middleware 2018 to create user interfaces to interact with users of the system. Alternatively, or additionally, in some systems, interactions with a user may occur through a presentation layer, such as the presentation layer 2044. In these systems, the application/module "logic" can be separated from the aspects of the application/module that interact with a user.

Some software architectures 2002 utilize virtual machines. In the example of FIG. 9, this is illustrated by a virtual machine 2048 (e.g., virtual machine 4008). The virtual machine 2048 creates a software environment where applications/modules can execute as if they were executing on a hardware machine (such as the machine 2100 of FIG. 10, for example). The virtual machine 2048 is hosted by a host operating system (e.g., operating system 2014 in FIG. 9) and typically, although not always, has a virtual machine monitor 2046, which manages the operation of the virtual machine 2048 as well as the interface with the host operating system (e.g., operating system 2014). A software architecture executes within the virtual machine 2048, such as an operating system 2050, libraries 2052, frameworks/middleware 2054, applications 2056, and/or a presentation layer 2058. These layers of software architecture executing within the virtual machine 2048 can be the same as corresponding layers previously described or may be different.

Example Machine Architecture and Machine-Readable Medium

Figure 10:
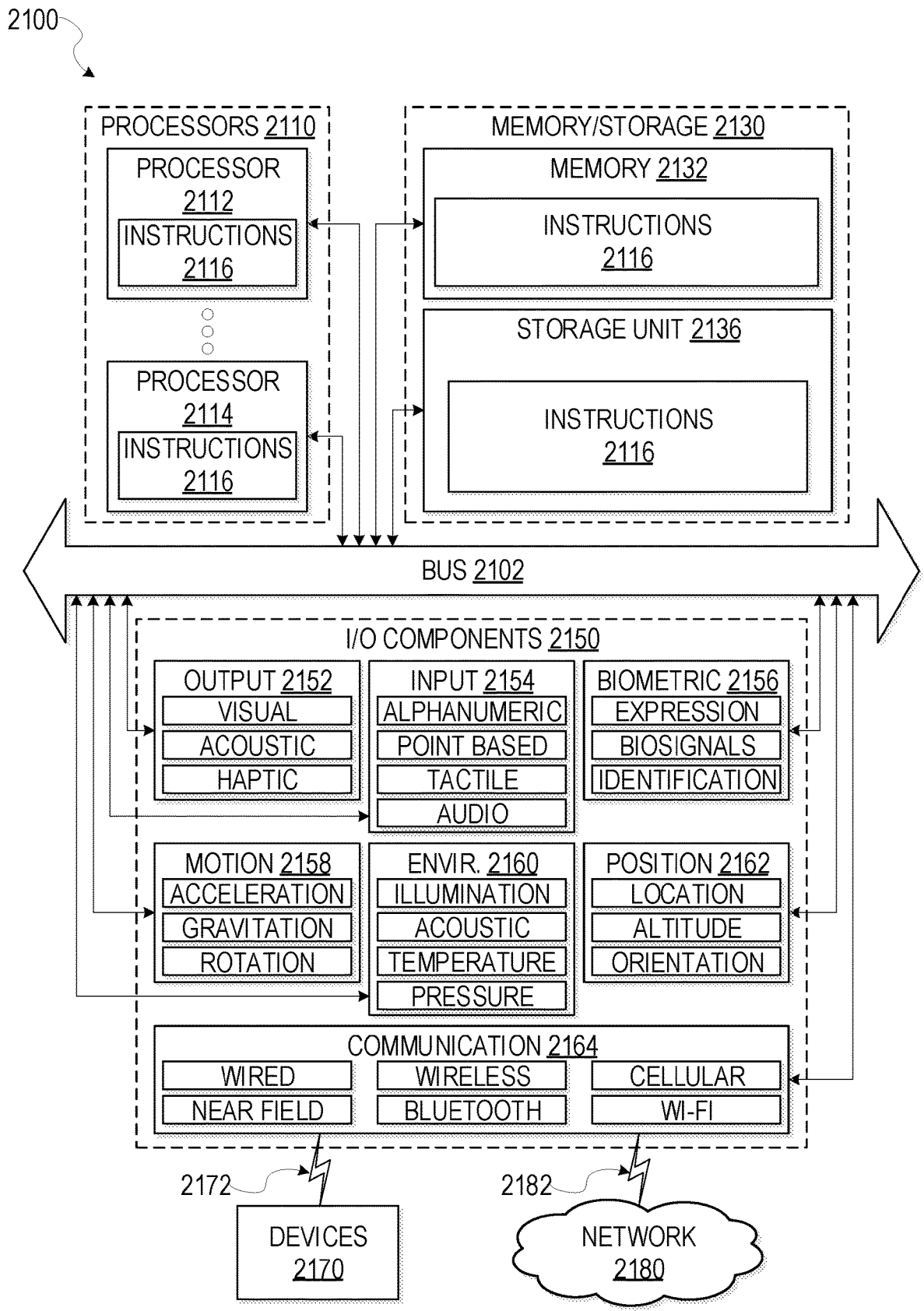
FIG. 10 is a block diagram illustrating components of a machine, according to some example embodiments.

FIG. 10 is a block diagram illustrating components of a machine 2100, according to some example embodiments, able to read instructions from a machine-readable medium (e.g., a machine-readable storage medium) and perform any one or more of the methodologies discussed herein. Specifically, FIG. 10 shows a diagrammatic representation of the machine 2100 in the example form of a computer system, within which instructions 2116 (e.g., software, a program, an application, an applet, an app, or other executable code) for causing the machine 2100 to perform any one or more of the methodologies discussed herein may be executed. For example, the instructions 2116 may cause the machine 2100 to execute the flow diagrams of FIGS. 8A-8C. Additionally, or alternatively, the instructions 2116 may implement the model modules 31 and the transform modules 30 of FIG. 4A. The instructions 2116 transform the general, non-programmed machine 2100 into a particular machine 2100 programmed to carry out the described and illustrated functions in the manner described. In alternative embodiments, the machine 2100 operates as a standalone device or may be coupled (e.g., networked) to other machines 2100. In a networked deployment, the machine 2100 may operate in the capacity of a server machine or a client machine in a server-client network environment, or as a peer machine in a peer-to-peer (or distributed) network environment. The machine 2100 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine 2100 capable of executing the instructions 2116, sequentially or otherwise, that specify actions to be taken by the machine 2100. Further, while only a single machine 2100 is illustrated, the term "machine" shall also be taken to include a collection of machines 2100 that individually or jointly execute the instructions 2116 to perform any one or more of the methodologies discussed herein.

The machine 2100 may include processors 2110, memory/storage 2130, and I/O components 2150, which may be configured to communicate with each other such as via a bus 2102. In an example embodiment, the processors 2110 (e.g., a CPU, a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 2112 and a processor 2114 that may execute the instructions 2116. The term "processor" is intended to include multi-core processors 2110 that may comprise two or more independent processors 2110 (sometimes referred to as "cores") that may execute the instructions 2116 contemporaneously. Although FIG. 10 shows multiple processors 2110, the machine 2100 may include a single processor 2110 with a single core, a single processor 2110 with multiple cores (e.g., a multi-core processor), multiple processors 2110 with a single core, multiple processors 2110 with multiples cores, or any combination thereof.

The memory/storage 2130 may include a memory 2132, such as a main memory, or other memory storage, and a storage unit 2136, both accessible to the processors 2110 such as via the bus 2102. The storage unit 2136 and memory 2132 store the instructions 2116, embodying any one or more of the methodologies or functions described herein. The instructions 2116 may also reside, completely or partially, within the memory 2132, within the storage unit 2136, within at least one of the processors 2110 (e.g., within the processor's cache memory), or any suitable combination thereof, during execution thereof by the machine 2100. Accordingly, the memory 2132, the storage unit 2136, and the memory of the processors 2110 are examples of machine-readable media.

As used herein, "machine-readable medium" means a device able to store the instructions 2116 and data temporarily or permanently and may include, but not be limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 2116. The term "machine-readable medium" shall also be taken to include any medium, or combination of multiple media, that is capable of storing instructions (e.g., instructions 2116) for execution by a machine (e.g., machine 2100), such that the instructions, when executed by one or more processors of the machine (e.g., processors 2110), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

The I/O components 2150 may include a wide variety of components to receive input, provide output, produce output, transmit information, exchange information, capture measurements, and so on. The specific I/O components 2150 that are included in a particular machine 2100 will depend on the type of machine. For example, portable machines 2100 such as mobile phones will likely include a touch input device or other such input mechanisms, while a headless server machine will likely not include such a touch input device. It will be appreciated that the I/O components 2150 may include many other components that are not shown in FIG. 10. The I/O components 2150 are grouped according to functionality merely for simplifying the following discussion and the grouping is in no way limiting. In various example embodiments, the I/O components 2150 may include output components 2152 and input components 2154. The output components 2152 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 2154 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 2150 may include biometric components 2156, motion components 2158, environmental components 2160, or position components 2162 among a wide array of other components. For example, the biometric components 2156 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 2158 may include acceleration sensor components (e.g., accelerometer), gravitation sensor components, rotation sensor components (e.g., gyroscope), and so forth. The environmental components 2160 may include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas sensors to detect concentrations of hazardous gases for safety or to measure pollutants in the atmosphere), or other components that may provide indications, measurements, or signals corresponding to a surrounding physical environment. The position components 2162 may include location sensor components (e.g., a Global Position System (GPS) receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 2150 may include communication components 2164 operable to couple the machine 2100 to a network 2180 or devices 2170 via a coupling 2182 and a coupling 2172, respectively. For example, the communication components 2164 may include a network interface component or other suitable device to interface with the network 2180. In further examples, the communication components 2164 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 2170 may be another machine 2100 or any of a wide variety of peripheral devices (e.g., a peripheral device coupled via a USB).

Moreover, the communication components 2164 may detect identifiers or include components operable to detect identifiers. For example, the communication components 2164 may include radio frequency identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 2164, such as location via IP geolocation, location via Wi-Fi® signal triangulation, location via detecting an NFC beacon signal that may indicate a particular location, and so forth.

Transmission Medium

In various example embodiments, one or more portions of the network 2180 may be an ad hoc network, an intranet, an extranet, a virtual private network (VPN), a LAN, a wireless LAN (MILAN), a WAN, a wireless WAN (WWAN), a metropolitan area network (MAN), the Internet, a portion of the Internet, a portion of the public switched telephone network (PSTN), a plain old telephone service (POTS) network, a cellular telephone network, a wireless network, a Wi-Fi® network, another type of network, or a combination of two or more such networks. For example, the network 2180 or a portion of the network 2180 may include a wireless or cellular network and the coupling 2182 may be a Code Division Multiple Access (CDMA) connection, a Global System for Mobile communications (GSM) connection, or another type of cellular or wireless coupling. In this example, the coupling 2182 may implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 2116 may be transmitted or received over the network 2180 using a transmission medium via a network interface device (e.g., a network interface component included in the communication components 2164) and utilizing any one of a number of well-known transfer protocols (e.g., hypertext transfer protocol (HTTP)). Similarly, the instructions 2116 may be transmitted or received using a transmission medium via the coupling 2172 (e.g., a peer-to-peer coupling) to the devices 2170. The term "transmission medium" shall be taken to include any intangible medium that is capable of storing, encoding, or carrying the instructions 2116 for execution by the machine 2100, and includes digital or analog communications signals or other intangible media to facilitate communication of such software.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single invention or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A system comprising:
at least one processor and memory having instructions that, when executed, cause the at least one processor to perform operations comprising:
receiving table information via a first programmatic interface included in a plurality of programmatic interfaces, the table information including rows describing homes and columns describing attributes of the homes;
communicating the table information to a first machine learning model that utilizes learning to make predictions, the first machine learning model including logic for processing the table information to generate predicted values;
receiving the predicted values from the first machine learning model;
appending the predicted values to the table information to generate appended table information;
communicating the appended table information via a second programmatic interface included in the plurality of programmatic interfaces, the plurality of programmatic interfaces being a plurality of machine-to-machine interfaces; and
iterating the operations, the iterating the operations including processing the table information through a sequence of states to transition the rows describing the homes from acquisition to resale by appending the predicted values to the table information to generate the appended table information, both of the receiving operations and both of the communicating operations being performed by at least one machine with a machine interface included in the plurality of machine-to-machine interfaces and not being performed via any user interface by a user, the iterating the operations to facilitate a customization and a proliferation of the first machine learning model.

2. The system of claim 1, wherein the logic comprises:
disabling modeling in the first machine learning model responsive to identifying a conditioning in the table information; and
generating the predicted values based on the table information, wherein the predicted values include a column of predicted values.

3. The system of claim 2, the operations further comprising: selecting the first machine learning model from a plurality of machine learning models, and wherein the selecting the first machine learning model is based on selection information, wherein the selection information is configurable, and wherein a first user interface is being utilized by a machine for receiving the selection information from a user.

4. The system of claim 2, wherein the logic further comprises:
receiving a portion of the table information; and
processing the portion of the table information to generate the column of predicted values.

5. The system of claim 1, wherein the table information includes columns corresponding to attributes that are predetermined by the first programmatic interface.

6. The system of claim 1, wherein the logic further comprises:
receiving configuration information; and
processing the table information based on the configuration information.

7. The system of claim 6, wherein the operations further comprise:
receiving override information comprising overlay information; and
updating the configuration information based on the overlay information.

8. The system of claim 2, wherein the operations further comprise:
receiving override information comprising predicted override information; and
updating the column of predicted values based on the override information.

9. The system of claim 2, wherein the first machine learning model executes in a first state and wherein the first state is included in the sequence of states that are utilized to purchase and resell a home, and wherein the first state includes a price drop policy state, and wherein the first programmatic interface includes a price drop policy programmatic interface, and wherein the table information further includes a first attribute including an initial list price, and wherein the column of predicted values includes a first value including a list price.

10. A method comprising:
operations comprising:
receiving table information via a first programmatic interface included in a plurality of programmatic interfaces, the table information including rows describing homes and columns describing attributes of the homes, the receiving the table information being processed by at least one processor;
communicating the table information to a first machine learning model that utilizes learning to make predictions, the first machine learning model including logic for processing the table information to generate a plurality of predicted values, the communicating the table information being processed by at least one processor;
receiving the plurality of predicted values from the first machine learning model; appending the plurality of predicted values to the table information to generate appended table information;
communicating the appended table information via a second programmatic interface included in the plurality of programmatic interfaces, the plurality of programmatic interfaces being a plurality of machine-to-machine interface interfaces; and
iterating the operations, the iterating the operations including processing the table information through a sequence of states to transition the rows describing the homes from acquisition to resale by appending the predicted values to the table information to generate the appended table information, both of the receiving operations and both of the communicating operations being performed by at least one machine with a machine interface included in the plurality of machine-to-machine interfaces and not being performed via any user interface by a user, the iterating the operations to facilitate a customization and a proliferation of the first machine learning model.

11. The method of claim 10, wherein the logic further comprises:
disabling modeling in the first machine learning model responsive to identifying a conditioning in the table information; and
generating the plurality of predicted values based on a portion of the table information, wherein the plurality of predicted values includes a column of predicted values.

12. The method of claim 11, further comprising:
selecting the first machine learning model from a plurality of machine learning models, wherein the selecting the first machine learning model is based on selection information that is configurable, and wherein a first user interface is being utilized by a machine for receiving the selection information from a user.

13. The method of claim 11, wherein the logic further comprises:
receiving a portion of the table information; and
generating the column of predicted values based on the portion of the table information.

14. The method of claim 10, wherein the table information includes columns corresponding to attributes that are predetermined by the first programmatic interface.

15. The method of claim 10, wherein the logic further comprises:
receiving configuration information; and
processing the table information based on the configuration information.

16. The method of claim 15, further comprising:
receiving override information comprising overlay information; and
updating the configuration information based on the overlay information.

17. The method of claim 10, further comprising:
receiving override information comprising predicted override information; and
updating the plurality of predicted values based on the override information.

18. The method of claim 11, wherein the first machine learning model executes in a first state and wherein the first state is included in the sequence of states that are utilized to purchase and resell a home, and wherein the first state includes a price drop policy state, and wherein the first programmatic interface includes a price drop policy programmatic interface, and wherein the table information further includes a first attribute including an initial list price, and wherein the column of predicted values includes a first value including a list price.

19. A non-transitory machine-readable medium and storing a set of instructions that, when executed by a processor, causes a machine to perform operations comprising:
receiving table information via a first programmatic interface included in a plurality of programmatic interfaces, the table information including rows describing homes and columns describing attributes of the homes;
communicating the table information to a first machine learning model that utilizes learning to make predictions, the first machine learning model including logic for processing the table information to generate a plurality of predicted values;
receiving the plurality of predicted values from the first machine learning model; appending the plurality of predicted values to the table information to generate appended table information; and
communicating the appended table information via a second programmatic interface included in the plurality of programmatic interfaces, the plurality of programmatic interfaces being a plurality of machine-to-machine interface interfaces; and
iterating the operations, the iterating the operations including processing the table information through a sequence of states to transition the rows describing the homes from acquisition to resale by appending the predicted values to the table information to generate the appended table information, both of the receiving operations and both of the communicating operations being performed by at least one machine with a machine interface included in the plurality of machine-to-machine interfaces and not being performed via any user interface by a user, the iterating the operations to facilitate a customization and a proliferation of the first machine learning model.

20. The non-transitory machine-readable medium of claim 19, wherein the logic further comprises:
disabling modeling in the first machine learning model responsive to identifying a conditioning in the table information; and
generating the plurality of predicted values based on a portion of the table information, wherein the plurality of predicted values includes a column of predicted values.

* * * * *